United States Patent
Araki et al.

(10) Patent No.: US 9,829,753 B2
(45) Date of Patent: Nov. 28, 2017

(54) DISPLAY DEVICE

(71) Applicant: Japan Display Inc., Tokyo (JP)

(72) Inventors: Shigesumi Araki, Tokyo (JP); Toshiyuki Higano, Tokyo (JP); Emi Higano, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/070,820

(22) Filed: Mar. 15, 2016

(65) Prior Publication Data

US 2016/0274403 A1    Sep. 22, 2016

(30) Foreign Application Priority Data

Mar. 19, 2015    (JP) ................... 2015-056512

(51) Int. Cl.
*G02F 1/1339*    (2006.01)
*H01L 27/12*    (2006.01)
*H01L 29/786*    (2006.01)
*G02F 1/1335*    (2006.01)

(52) U.S. Cl.
CPC .... *G02F 1/13394* (2013.01); *G02F 1/133512* (2013.01); *H01L 27/124* (2013.01); *H01L 29/78633* (2013.01); *G02F 2001/13396* (2013.01); *G02F 2001/13398* (2013.01)

(58) Field of Classification Search
CPC ........... G02F 1/13394; G02F 1/133512; G02F 2001/13396; G02F 2001/13398; H01L 27/124; H01L 29/78633; H01L 2021/775; H01L 27/1214; H01L 27/3232; H01L 51/0076; H01L 27/14603; H01L 27/14605; H01L 27/14609; H01L 27/14812; H01L 27/3248; H01L 27/326
See application file for complete search history.

(56) References Cited

U.S. PATENT DOCUMENTS

| | | | |
|---|---|---|---|
| 2005/0200784 A1* | 9/2005 | Kume | G02F 1/133555 349/130 |
| 2006/0268203 A1* | 11/2006 | Kurahashi | G02F 1/1347 349/108 |
| 2007/0064162 A1 | 3/2007 | Yamamoto et al. | |
| 2008/0316413 A1* | 12/2008 | Cho | G02F 1/134309 349/144 |

FOREIGN PATENT DOCUMENTS

JP    2007-010753 A    1/2007

* cited by examiner

*Primary Examiner* — Cuong B Nguyen
*Assistant Examiner* — Samuel Park
(74) *Attorney, Agent, or Firm* — Typha IP LLC

(57) ABSTRACT

A display device includes a first light shielding area where two signal lines are arranged between the opening portions of mutually adjacent sub pixels, a second light shielding area where one signal line is arranged between the opening portions of mutually adjacent sub pixels, and a third light shielding area where one scanning line is arranged between the opening portions of mutually adjacent sub pixels. The display device further includes a first spacer arranged in the first light shielding area or the second light shielding area along the extending direction of the signal line and a second spacer arranged in the third light shielding area along the extending direction of the scanning line. The first spacer and the second spacer are arranged crosswise.

4 Claims, 33 Drawing Sheets

DISPLAY DEVICE

CLAIM OF PRIORITY

The present application claims priority from Japanese patent application JP2015-56512 filed on Mar. 19, 2015, the content of which is hereby incorporated by reference into this application.

BACKGROUND

This disclosure relates to a display device and is applicable to, for example, a display device of RGBW method.

BACKGROUND ART

White display luminance in a liquid crystal display is determined by the luminance of a backlight and the transmittance of a liquid crystal. Improving the luminance of a backlight results in an increase of power consumption; therefore, it is preferable to improve the transmittance of a liquid crystal if possible. As a method of actually improving the transmittance of a liquid crystal to enhance the white luminance for realizing a white peak display, there is an example, for example, as disclosed in Japanese Patent Application Laid-Open No. 2007-010753, of using a white pixel other than three primary colors: red, green, and blue without increasing the power consumption, to improve the transmittance characteristic. In short, the display device is made by pixel group including four sub pixels: red, green, blue, and white.

SUMMARY

The inventor et al. have examined the arrangement of the spacers that maintain a space between an array substrate and an opposite substrate, in a display device of RGBW method in which a half of blue sub pixels, of red, green, and blue sub pixels, are replaced with white sub pixels. That is, examination has been made of the arrangement of a cross-shape column formed by the long spacers respectively provided in the array substrate and the opposite substrate and arranged in a crossing way.

An object of this disclosure is to provide a cross-shape column suitable for a display of RGBW method.

Other objects and novel characteristics will be apparent from the description of this disclosure and the attached drawings.

Of the disclosure, the outline of the typical one will be briefly described as follows.

A display device includes a first light shielding area where two signal lines are arranged between the opening portions of mutually adjacent sub pixels, a second light shielding area where one signal line is arranged between the opening portions of mutually adjacent sub pixels, and a third light shielding area where one scanning line is arranged between the opening portions of mutually adjacent sub pixels. The display device further includes a first spacer arranged in the first light shielding area or the second light shielding area along the extending direction of the signal line and a second spacer arranged in the third light shielding area along the extending direction of the scanning line, and the first spacer and the second spacer are arranged crosswise.

DESCRIPTION OF THE PREFERRED EMBODIMENTS

Figure 1:
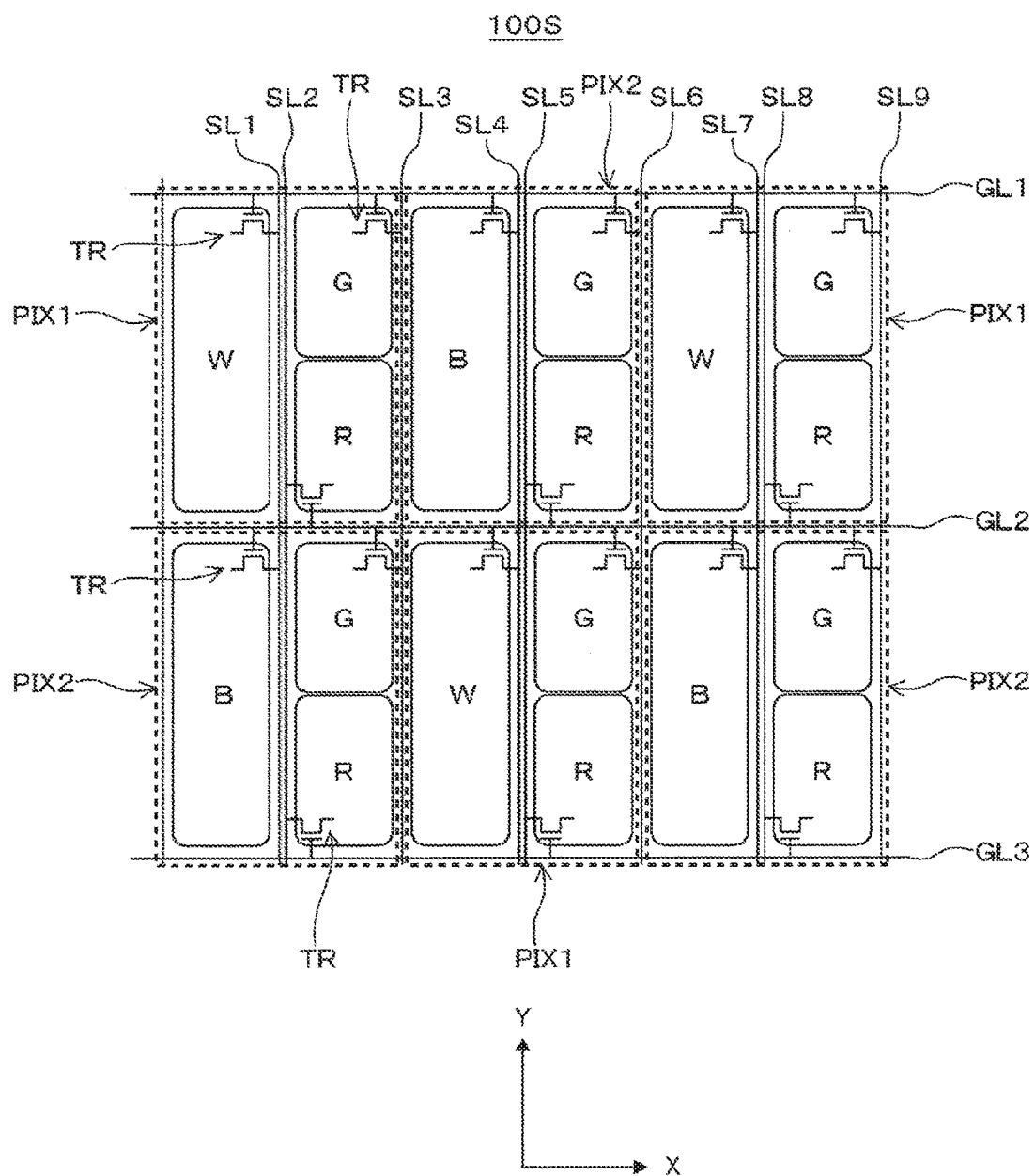
FIG. 1 is a top plan view for use in describing a display according to RGBW method.

Hereinafter, embodiments, comparison examples, examples, and modified examples will be described with reference to the drawings. The disclosure is only one example and various modifications properly made within the spirit of the invention that would be easily arrived at by those skilled in the art are naturally to be included in the scope of the invention. To make the description clearer, width, thickness, and shape of each unit may be schematically illustrated in the drawings, differently from the actual form; it is only one example and not to restrict the interpretation of the invention. Further, the same reference codes are attached to those having been described in the previous drawing and the detailed description thereof may be properly omitted.

<Pixel Arrangement of RGBW Method>

At first, pixel arrangement of a display device of RGBW method examined by the inventor et al. (hereinafter, simply referred to as "RGBW method") will be described using FIG. 1. FIG. 1 is a top plan view illustrating the arrangement of pixels, scanning lines, and signal lines in a display device of RGBW method.

As illustrated in FIG. 1, a display device 100S of RGBW method has a first pixel PIX1 including a red sub pixel (R), a green sub pixel (G), and a white sub pixel (W) and a second pixel PIX2 including a red sub pixel (R), a green sub pixel (G), and a blue sub pixel (B). In order to improve the transmittance by adding W, in the display device 100S, a half of the blue sub pixels are replaced with the white sub pixels. Each opening area of the green sub pixel and the red sub pixel is half of each opening area of the blue sub pixel and the white sub pixel. The first pixel PIX1 has the red sub pixel and the green sub pixel adjacently arranged in the Y direction and has the red and green sub pixels and the white sub pixel adjacently arranged in the X direction. The second pixel PIX2 has the red sub pixel and the green sub pixel adjacently arranged in the Y direction and has the red and green sub pixels and the blue sub pixel adjacently arranged in the X direction. In the X direction, the first pixels PIX1 and the second pixels PIX2 are alternately arranged, and in the Y direction, the first pixels PIX1 and the second pixels PIX2 are alternately arranged. FIG. 1 indicates three first pixels PIX1 and three second pixels PIX2. Each opening shape of the red, green, blue, and white sub pixels is rectangle and the length in the Y direction is longer than the length in the X direction. Four corners of the opening of each sub pixel are rounded in a rectangle shape. It is preferable that the X direction is orthogonal to the Y direction.

Each sub pixel of red, green, blue, and white includes a thin film transistor (TFT) TR connected to a scanning line (gate line) and a signal line (source line). The scanning line is connected to a gate electrode of the thin film transistor TR and the signal line is connected to a source electrode of the thin film transistor TR. The signal line is sometimes referred to as a drain line and an electrode of the thin film transistor TR connected to a drain line is sometimes referred to as a drain electrode.

The green and the white sub pixels of the first pixel PIX1 arranged between the scanning line GL1 and the scanning line GL2 are connected to the scanning line GL1, and the red sub pixel is connected to the scanning line GL2. The green and the blue sub pixels of the second pixel PIX2 arranged between the scanning line GL2 and the scanning line GL3 are connected to the scanning line GL2, and the red sub pixel is connected to the scanning line GL3. In other words, the red sub pixel of the first pixel PIX1 and the green sub pixel of the second pixel PIX2 that are adjacent to each other with the scanning line GL2 intervening therebetween are connected to the scanning line GL2. The red sub pixel of the second pixel PIX2 and the green sub pixel of the first pixel PIX1 that are adjacent to each other with the scanning line GL2 intervening therebetween are connected to the scanning line GL2. The white sub pixel of the first pixel PIX1 is connected to the scanning line GL1 and the blue sub pixel of the second pixel PIX2 is connected to the scanning line GL2, which pixels are adjacent to each other with the scanning line GL2 intervening therebetween. In other words, the red sub pixel and the green sub pixel that are adjacent to each other in the Y direction are connected to the same scanning line and the blue sub pixel and the white sub pixel that are adjacent to each other in the Y direction are connected to the different scanning lines.

The respective signal lines SL1, SL4, and SL7 are connected to the blue and white sub pixels, the respective signal lines SL2, SL5, and SL8 are connected to the red sub pixels, and the respective signal lines SL3, SL6, and SL9 are connected to the green sub pixels. The red and green sub pixels are arranged between the signal line SL2 and the signal line SL3 and the blue and white sub pixels are arranged between the signal line SL3 and the signal line SL4. In other words, the red sub pixel arranged between the signal line SL2 and the signal line SL3 is connected to the signal line SL2, and the green sub pixel arranged between the signal line SL2 and the signal line SL3 is connected to the signal line SL3. The blue and the white sub pixels arranged between the signal line SL3 and the signal line SL4 are connected to the signal line SL4. There is no sub pixel arranged between the signal line SL1 and the signal line SL2. In other words, between the opening portions of sub pixels, the display device 100S has a portion including one signal line and a portion including two signal lines.

A light shielding film (black matrix) is arranged in the opening portions of the sub pixels. An area covered with the light shielding film is referred to as a light shielding area. In FIG. 1, thin film transistors TR seem to be positioned respectively in the opening portions of the sub pixels but the thin film transistors TR are actually positioned in the light shielding area.

<Cross-Shape Column>

Figure 2:
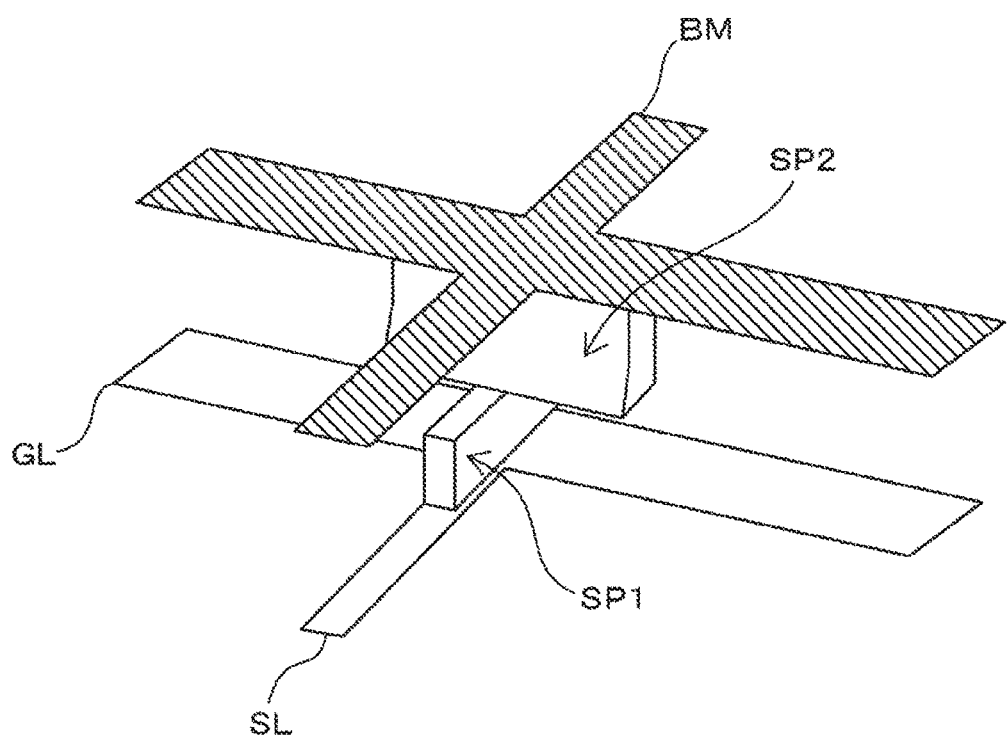
FIG. 2 is a perspective view for use in describing a cross-shape column.

Next, a cross-shape column examined by the inventor et al. will be described using FIG. 2. FIG. 2 is a perspective view showing the shape of the cross-shape column.

A rectangular parallelepiped first spacer SP1 extending along the scanning line GL or the signal line SL is formed on an array substrate where the scanning line GL and the signal line SL are formed, a rectangular parallelepiped second spacer SP2 extending along the scanning line GL or the signal line SL is formed on an opposite substrate where a light shielding film BM is formed, and the first spacer SP1 and the second spacer SP2 are crossed at right angle, hence to form a column spacer by the cross point (intersection surface) thereof. FIG. 2 indicates the case of providing the first spacer SP1 along the signal line SL and providing the second spacer SP2 along the scanning line GL.

In the pixels of the display device of RGBW method, location of the column spacer, especially the location of the cross-shape column is restricted because of the uniqueness of the pixel shape. In a fine pixel, contact holes for connecting a pixel electrode and a drain electrode are close to each other and when forming a column on the side of the array substrate with an organic flattening film, the SS density gets unstable in the case of SS bumping into the space between the contact holes and in the case of upwardly deviation.

First Embodiment

Figure 3:
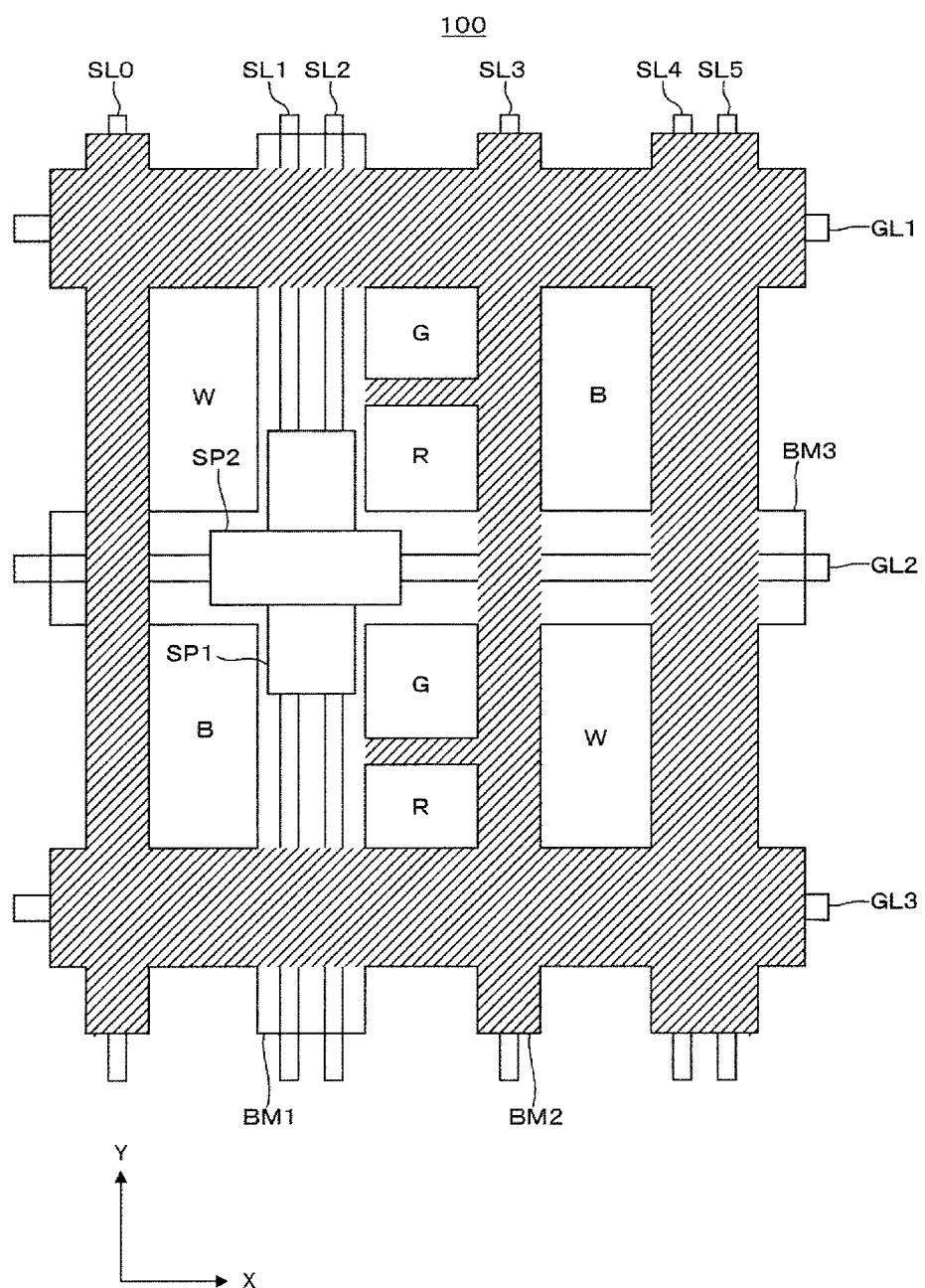
FIG. 3 is a top plan view for use in describing the structure of a display device according to a first embodiment.

Next, a display device according to a first embodiment will be described using FIG. 3. FIG. 3 is a top plan view illustrating the disposition of scanning lines, signal lines, spacers, and light shielding film in the display device according to the embodiment. In FIG. 3, a light shielding area where the spacers are arranged is illustrated with the light shielding film removed therefrom.

A display device 100 according to the embodiment includes a first light shielding area BM1, a second light shielding area BM2, a third light shielding area BM3, a first spacer SP1, and a second spacer SP2. The first light shielding area BM1 is arranged between the opening portions of mutually adjacent sub pixels (white sub pixel and red sub pixel, white sub pixel and green sub pixel, blue sub pixel and green sub pixel, and blue sub pixel and red sub pixel) and provided with two signal lines SL1 and SL2. The second light shielding area BM2 is arranged between the opening portions of the mutually adjacent sub pixels (red sub pixel and blue sub pixel, green sub pixel and blue sub pixel, green sub pixel and white sub pixel, and red sub pixel and white sub pixel) and provided with one signal line SL3. The third light shielding area BM3 is arranged between the opening portions of mutually adjacent sub pixels (red sub pixel and green sub pixel) and provided with one scanning line GL2. A first spacer SP1 is provided along an extending direction of a signal line (Y direction) and arranged in the first light shielding area BM1. A second spacer SP2 is provided along an extending direction of a scanning line (X direction) and arranged in the third light shielding area BM3. The first spacer SP1 and the second spacer SP2 are arranged crosswise. The first spacer SP1 and the second spacer SP2 form a column spacer by their intersection surfaces. The X direction is preferably orthogonal to the Y direction.

The first spacer SP1 is provided on an array substrate where the scanning lines GL1, GL2, and GL3 and the signal lines SL0 to SL5 are formed and the second spacer SP2 is provided on an opposite substrate where a light shielding film forming the first to the third light shielding areas BM1, BM2, and BM3 is formed. The first spacer may be provided on the opposite substrate and the second spacer may be provided on the array substrate.

Second Embodiment

Figure 4:
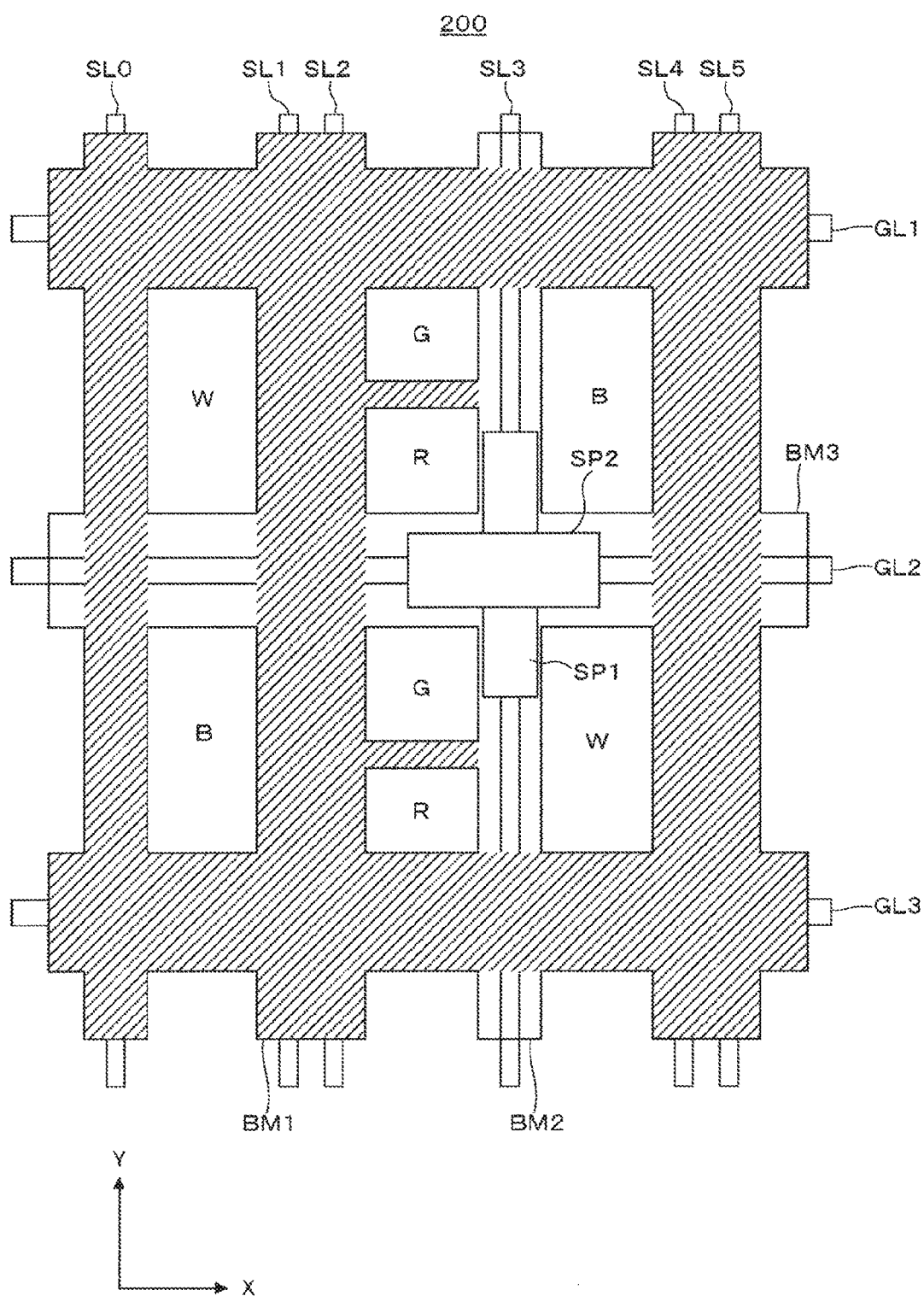
FIG. 4 is a top plan view for use in describing the structure of a display device according to a second embodiment.

Next, a display device according to a second embodiment will be described using FIG. 4. FIG. 4 is a top plan view illustrating the disposition of scanning lines, signal lines, spacers, and light shielding film in the display device according to the embodiment. In FIG. 4, a light shielding area where the spacers are arranged is illustrated with the light shielding film removed therefrom.

A display device 200 according to the second embodiment has the same structure as that of the display device 100 except that the first spacer SP1 is arranged in the second light shielding area BM2.

According to the display device 100 and the display device 200, even when the array substrate and the opposite substrate are a little deviated from each other in the X direction and the Y direction or in a direction between the X direction and the Y direction, the first spacer SP1 and the second spacer SP2 keep overlapping. In other words, the column spacer structure can be kept, thereby reducing the possibility of hurting a film or an element outside the spacer portion in contact with it.

First Example

Figure 5:
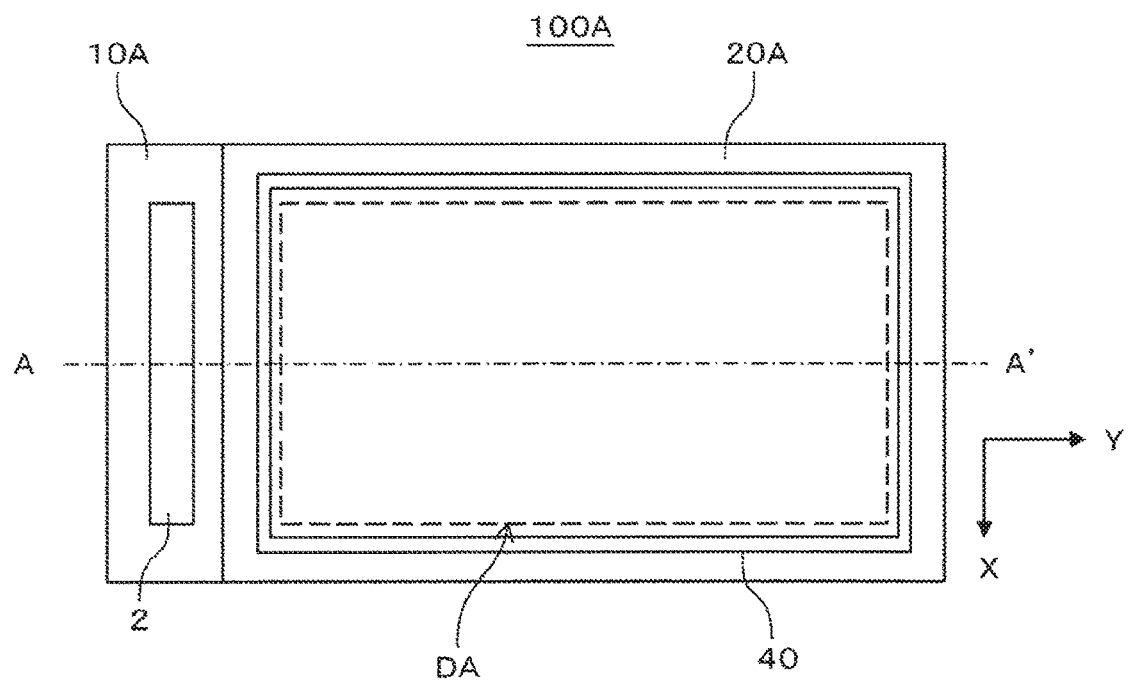
FIG. 5 is a top plan view for use in describing a display device according to a first example.
Figure 6:
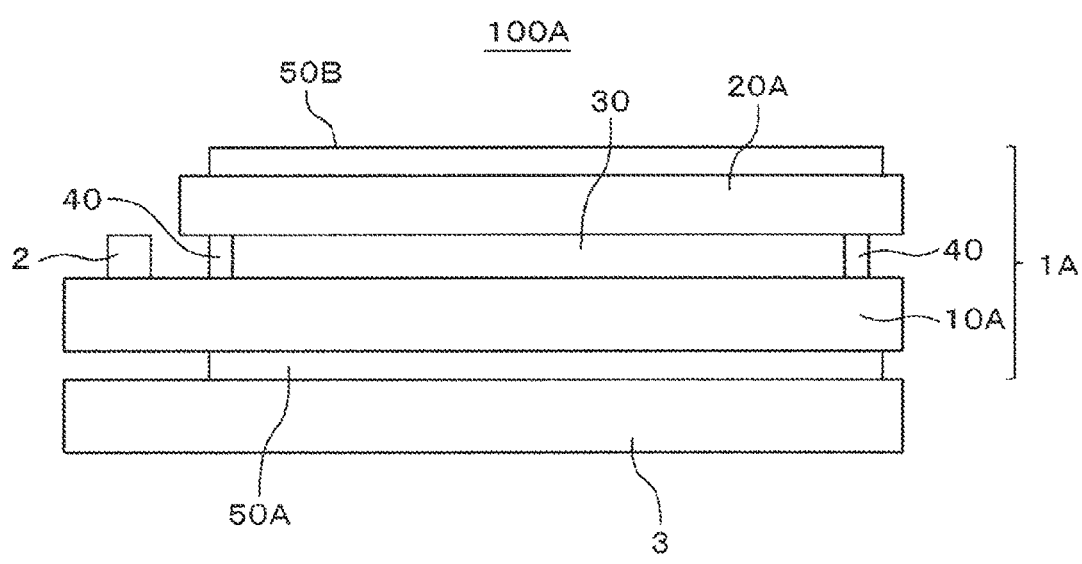
FIG. 6 is a cross-sectional view for use in describing the display device according to the first example.
Figure 7:
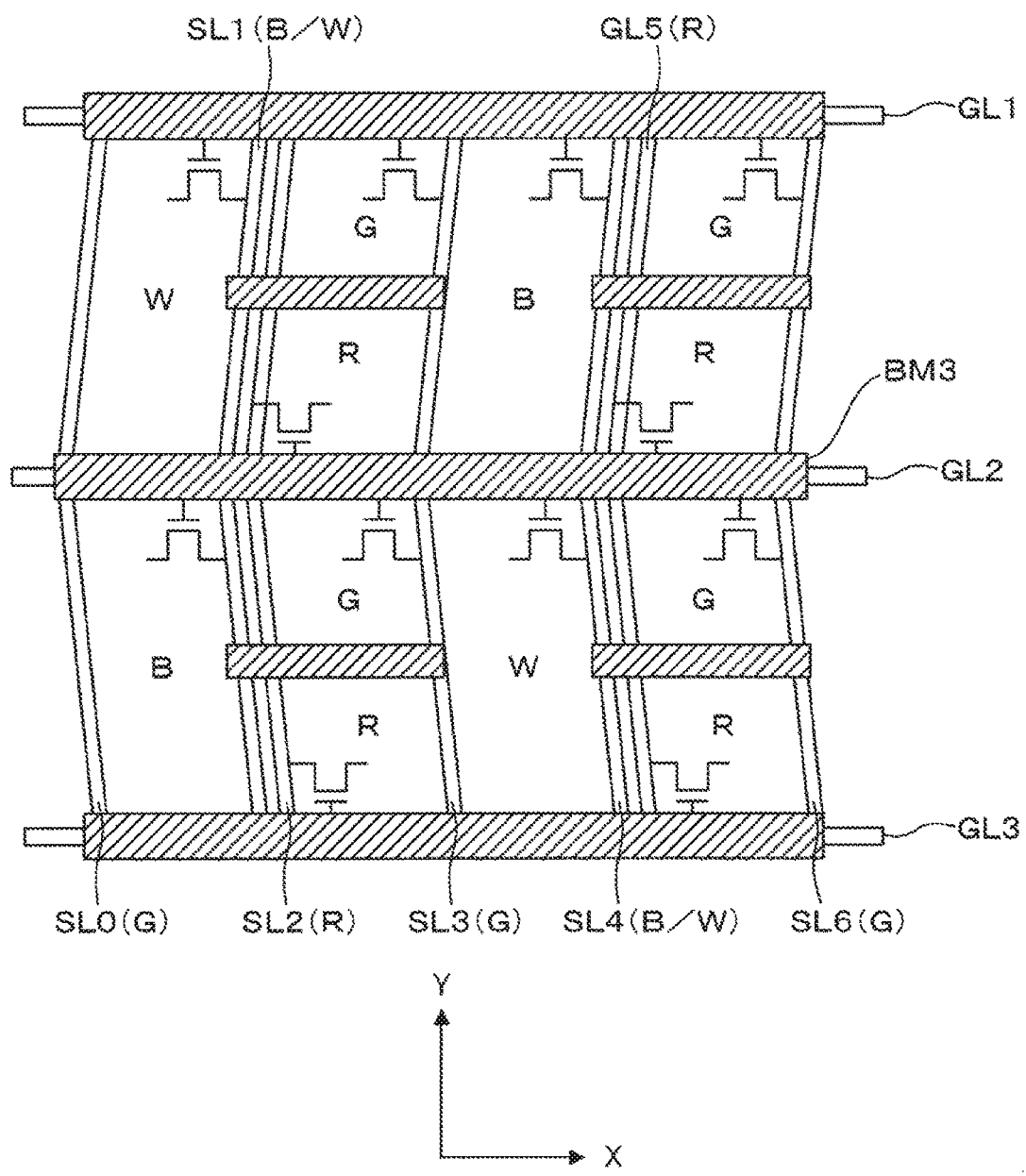
FIG. 7 is a top plan view for use in describing the display device according to the first example.
Figure 8A:
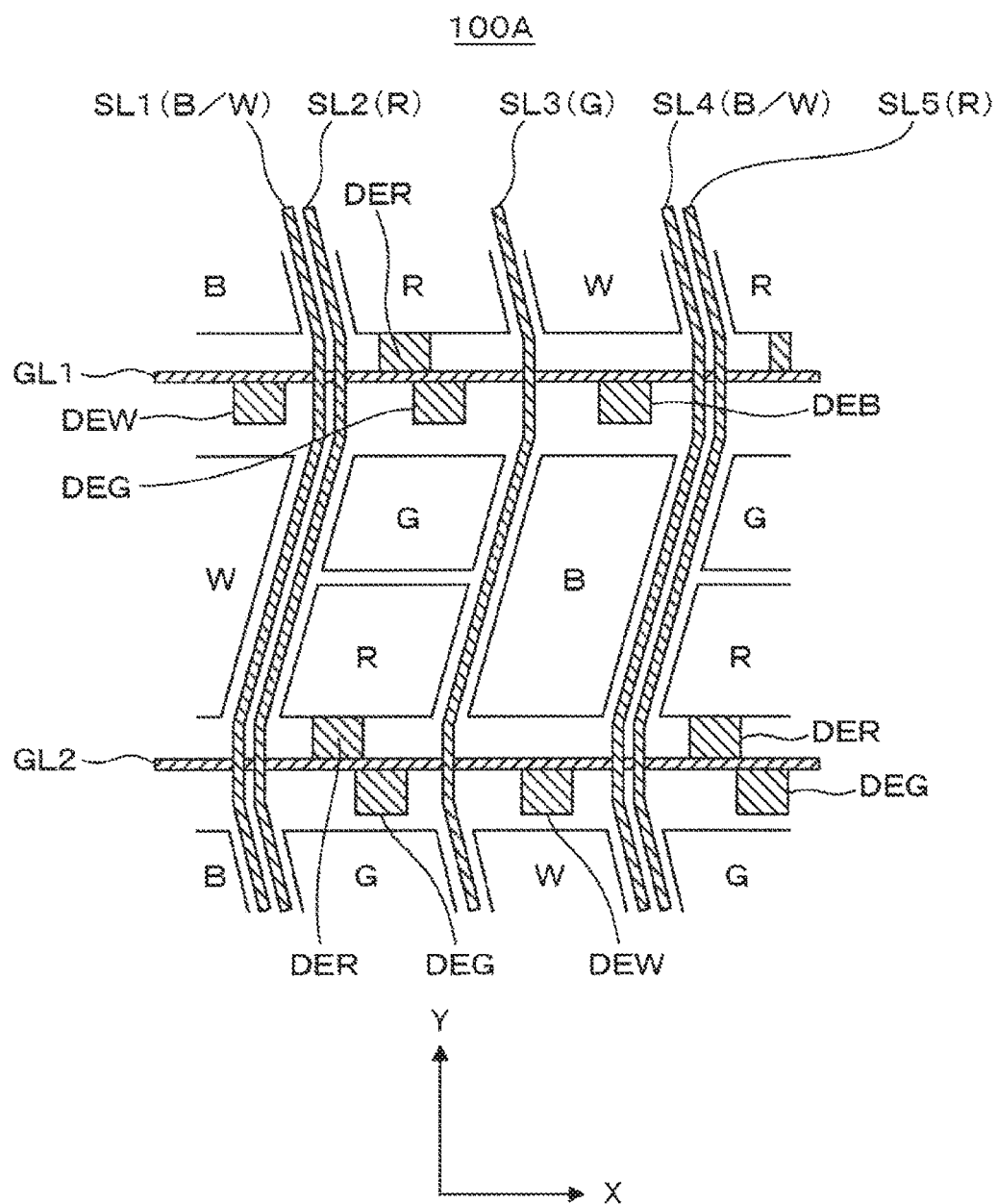
FIG. 8A is a top plan view for use in describing the display device according to the first example.
Figure 8B:
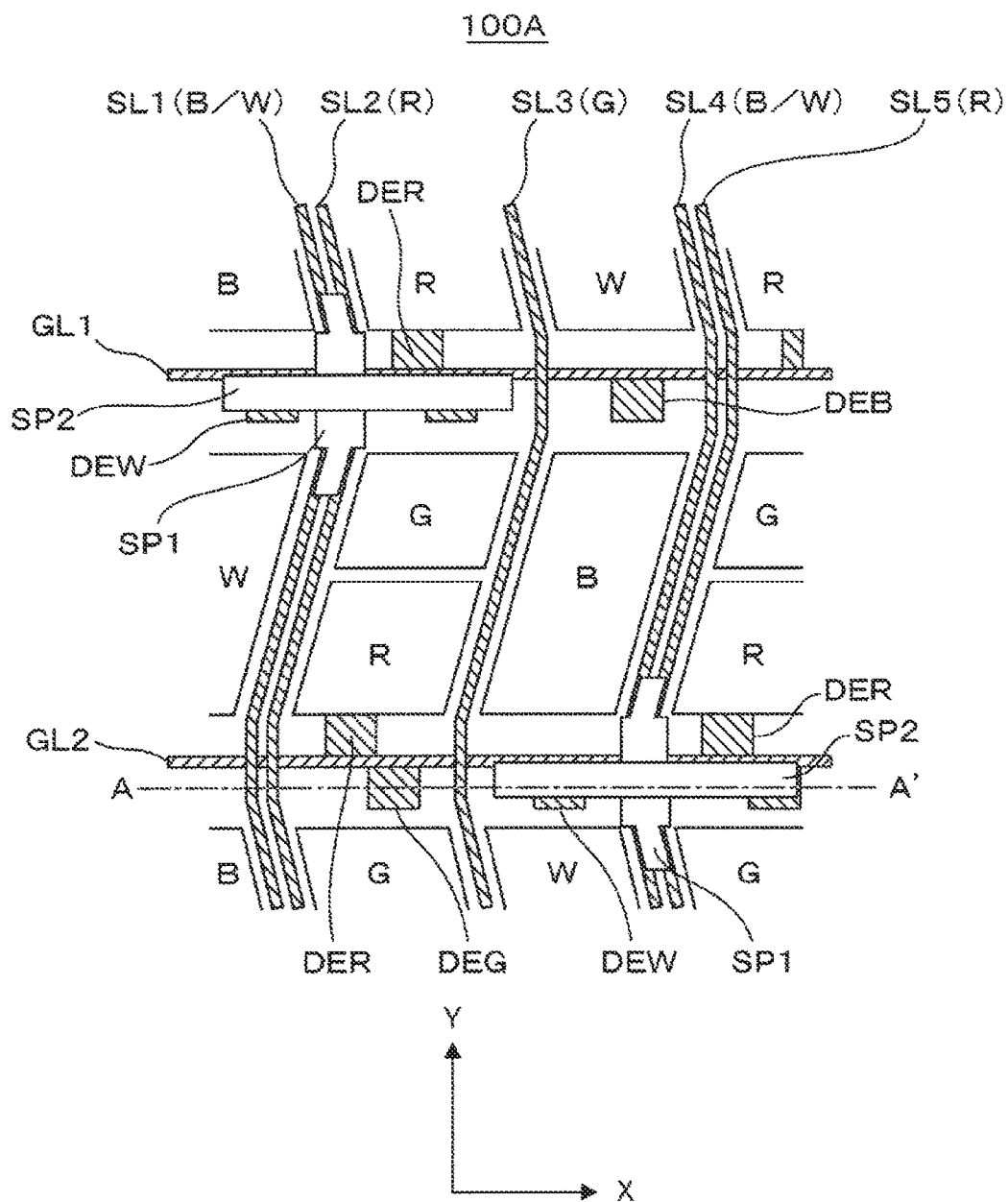
FIG. 8B is a top plan view for use in describing the display device according to the first example.
Figure 9:
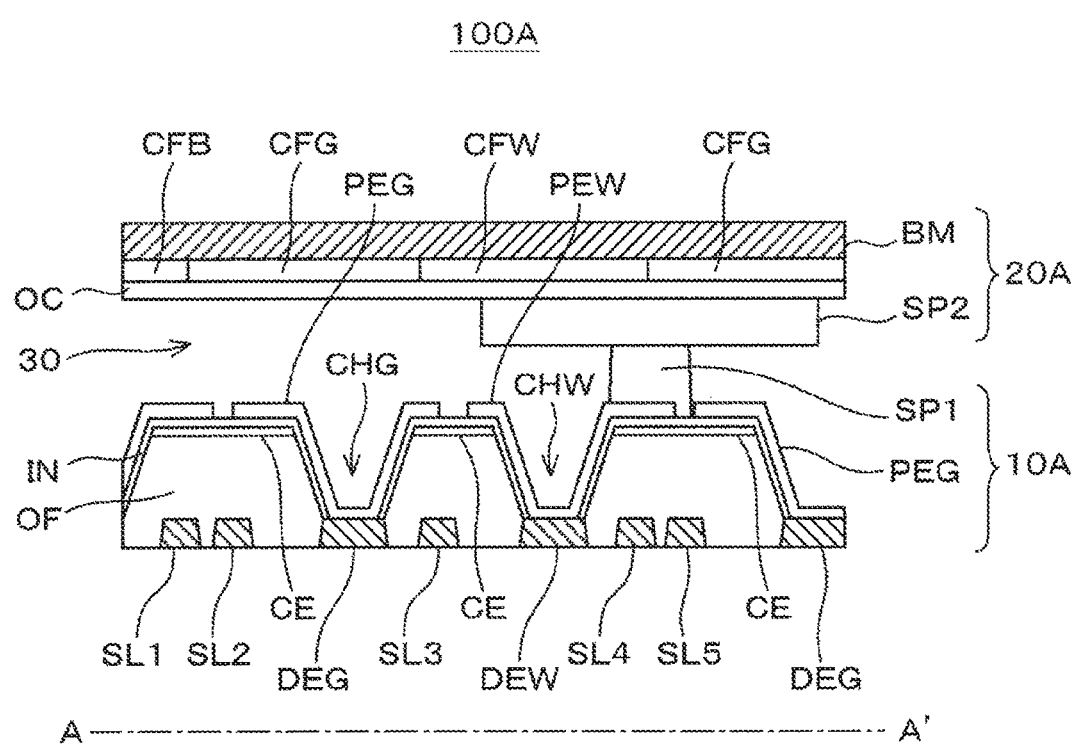
FIG. 9 is a cross-sectional view for use in describing the display device according to the first example.

An example (first example) according to the first embodiment will be described using FIGS. 5 to 9. FIG. 5 is a top plan view illustrating the structure of a display device according to the first example. FIG. 6 is a cross-sectional view taken along the line A-A' of FIG. 5. FIG. 7 is a top plan view illustrating a part of pixel arrangement, scanning lines, signal lines, and light shielding area of the display device according to the first example. FIG. 8A is a top plan view illustrating the scanning lines, signal lines, drain terminals, and pixel opening portions of the display device according to the first example. FIG. 8B is a top plan view with the spacers added to FIG. 8A. FIG. 9 is a cross-sectional view taken along the line A-A' of FIG. 8B.

As illustrated in FIGS. 5 and 6, a display device 100A according to the first example includes a display panel 1A, a driver IC 2, and a backlight 3. The display panel 1A includes an array substrate 10A, an opposite substrate 20A, and a liquid crystal material (liquid crystal layer) 30 sealed between the array substrate 10A and the opposite substrate 20A. The array substrate 10A is adhered to the opposite substrate 20A by a ring-shaped sealing material 40 surrounding the display area DA and the liquid crystal layer 30 is hermetically sealed by the array substrate 10A, the opposite substrate 20A, and the sealing material 40. Further, a lower polarization plate 50A and an upper polarization plate 50B are respectively provided on the outer surfaces of the array substrate 10A and the opposite substrate 20A, in other words, on the rear surfaces opposite to the liquid crystal layer 30. The display area DA is formed by a plurality of groups of pixels, for example, arranged in a matrix shape. The array substrate 10A includes TFT, scanning lines, signal lines, pixel electrodes, and a scanning circuit for driving the scanning lines formed by TFT not illustrated. The driver IC 2 includes a circuit for driving signal lines not illustrated.

The arrangement of the pixels, scanning lines, and signal lines of the display device 100A is similar to that of the display device 100S; however, the shape of the signal line and the sub pixel is different. As illustrated in FIG. 7, each sub pixel in the first pixel PIX1 arranged between the scanning line GL1 and the scanning line GL2 is a parallelogram inclined to the right and each sub pixel in the second pixel PIX2 arranged between the scanning line GL2 and the scanning line GL3 is a parallelogram inclined to the left. The signal lines SL1, SL2, SL3, and SL4 are inclined at a predetermined angle in the Y direction. The signal lines SL1, SL2, SL3, and SL4 arranged between the scanning line GL1 and the scanning line GL2 are inclined to the right in the Y direction, while the signal lines SL1, SL2, SL3, and SL4 arranged between the scanning line GL2 and the scanning line GL3 are inclined to the left in the Y direction. Although the signal lines are arranged in the light shielding area, it is not illustrated in FIG. 7.

Although it is not illustrated, each pixel electrode of a red sub pixel, a green sub pixel, a white sub pixel, and a blue sub pixel is formed by, for example, two comb-like electrodes and the longitudinal direction of the two comb-like electrode is arranged in parallel to the extending direction of the signal line. In other words, the longitudinal direction of the opening portion formed by a slit between the two comb-like electrodes is arranged in parallel to the extending direction of the signal line. The longitudinal direction of the opening portion formed by a slit between the two comb-like electrodes is inclined at a predetermined angle in the Y direction. According to this, two areas (two pixels pseudo dual-domain) having different horizontal rotation direction of liquid crystal molecules are formed in the pixels (sub pixel) arranged between the scanning line GL1 and the scanning line GL2 and in the pixels (sub pixel) arranged between the scanning line GL2 and the scanning line GL3.

As illustrated in FIGS. 8A and 8B, the scanning lines GL1 and GL2 are provided in the X direction, and the signal lines SL1, SL2, SL3, SL4, and SL5 are provided along the Y direction in the vicinity of crossing the scanning lines GL1 and GL2 and inclined at a predetermined angle from the Y direction between the opening portions of the sub pixels. A drain electrode DER connected to the pixel electrode of a red sub pixel is arranged on each upper side of the scanning lines GL1 and GL2 on the drawing and a drain electrode DEG connected to the pixel electrode of a green sub pixel is arranged on each lower side of the scanning lines GL1 and GL2 on the drawing. In other words, the drain electrode DER and the drain electrode DEG sandwich the scanning line GL1 or the scanning line GL2. A drain electrode DEW connected to the pixel electrode of a white sub pixel is arranged on each lower side of the scanning lines GL1 and GL2 on the drawing. A drain electrode DEB connected to the pixel electrode of a blue sub pixel is arranged on each lower side of the scanning lines GL1 and GL2 on the drawing.

As illustrated in FIG. 9, the signal lines SL1, SL2, SL3, SL4, and SL5 and the drain electrodes DEG and DEW are formed of a metal film in the same layer on a transparent substrate such as a glass substrate, not illustrated, in the array substrate 10A, and an organic flattening film OF is formed thereon. A common electrode CE is formed on the organic flattening film OF by a transparent conductive film such as ITO, and an interlayer insulating film IN is formed thereon. On the interlayer insulating film IN, the pixel electrodes PEG and PEW are formed. In the array substrate 10A, the first spacer SP1 is formed along, for example, the signal lines SL4 and SL5, and an alignment film, not illustrated, is formed on the interlayer insulating film IN, the pixel electrodes PEG and PEW, and the first spacer SP1.

In the opposite substrate 20A, a light shielding film (black matrix) BM is formed on a transparent substrate such as a glass substrate, not illustrated, and color filters CFB, CFG, and CFW are formed thereon. An overcoat film OC is formed on the color filters CFB, CFG, and CFW. In the opposite substrate 20A, the second spacer SP2 is formed on the overcoat film OC along the scanning line, and an alignment film, not illustrated, is formed on the overcoat film OC and the second spacer SP2.

The pixel electrodes PEG and PEW are connected to the drain electrodes DEG and DEW through the contact holes bored in the organic flattening film OF and the interlayer insulating film IN. For example, the pixel electrode PEG of a green sub pixel is connected to the drain electrode DEG through the contact hole CHG, and the pixel electrode PEW of a white sub pixel is connected to the drain electrode DEW through the contact hole CHW. As illustrated in FIGS. 8A and 8B, when arranging the signal lines and the drain electrodes (contact holes), the area having two adjacent signal lines have a wider flat portion than the area having one signal line. Accordingly, it is preferable that the first spacer SP1 is arranged in the area having the two adjacent signal lines, in the extending direction of the signal line. The scanning lines, the signal lines, the drain electrodes, the first spacer, and the second spacer are arranged in the light shielding area.

The first spacer SP1 is formed in a way of extending across one scanning line of the scanning line GL1 or the scanning line GL2 and not extending to another scanning line. The first spacer SP1 is formed wider in a portion of extending the signal lines SL1, SL2, SL4, and SL5 along the Y direction and narrower in an inclined portion of the above signal lines from the Y direction. The second spacer SP2 is formed in a way of extending across the two signal lines of the adjacent signal lines SL1 and SL2 or signal lines SL4 and SL5 and not extending to another distant signal line. Differently from the first spacer SP1, the second spacer SP2 is uniform in width. According to this, the density of the column gets stable.

Modified Example 1-1

Figure 10:
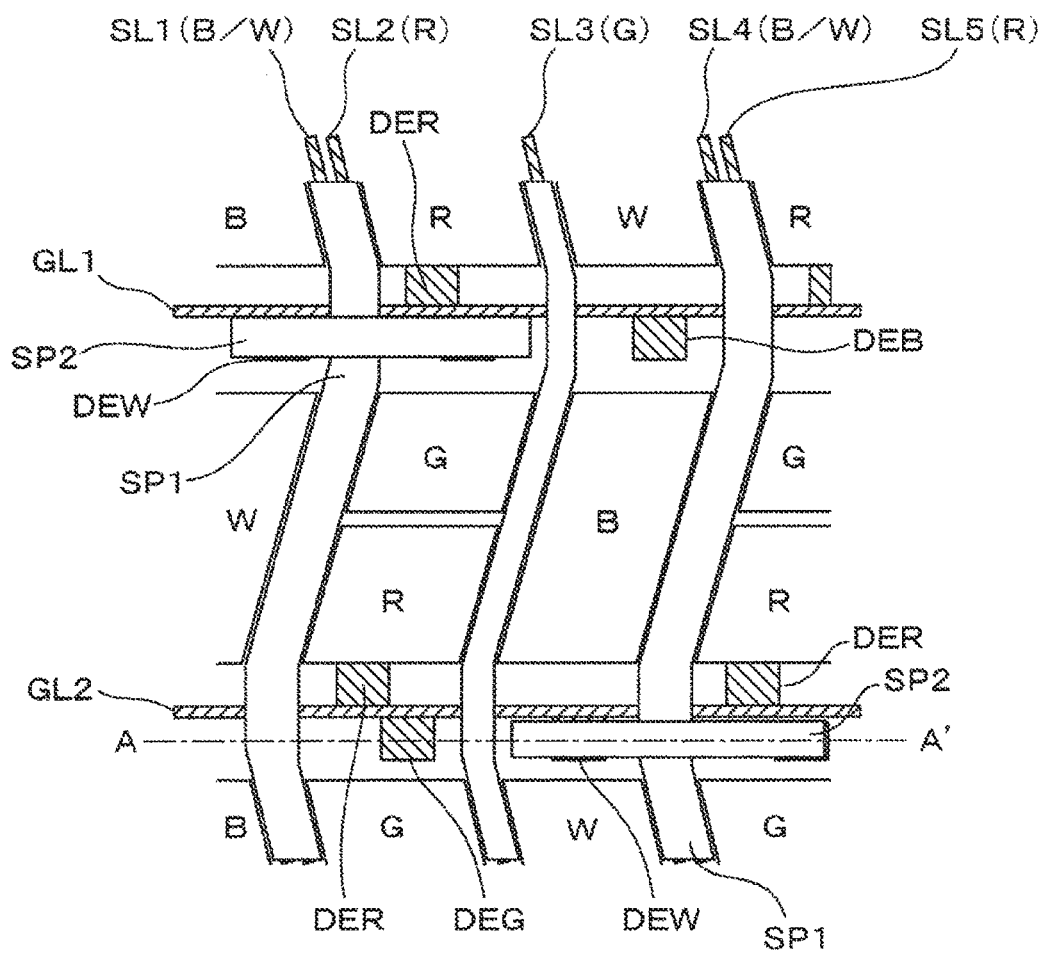
FIG. 10 is a top plan view for use in describing a display device according to a modified example 1-1.
Figure 11:
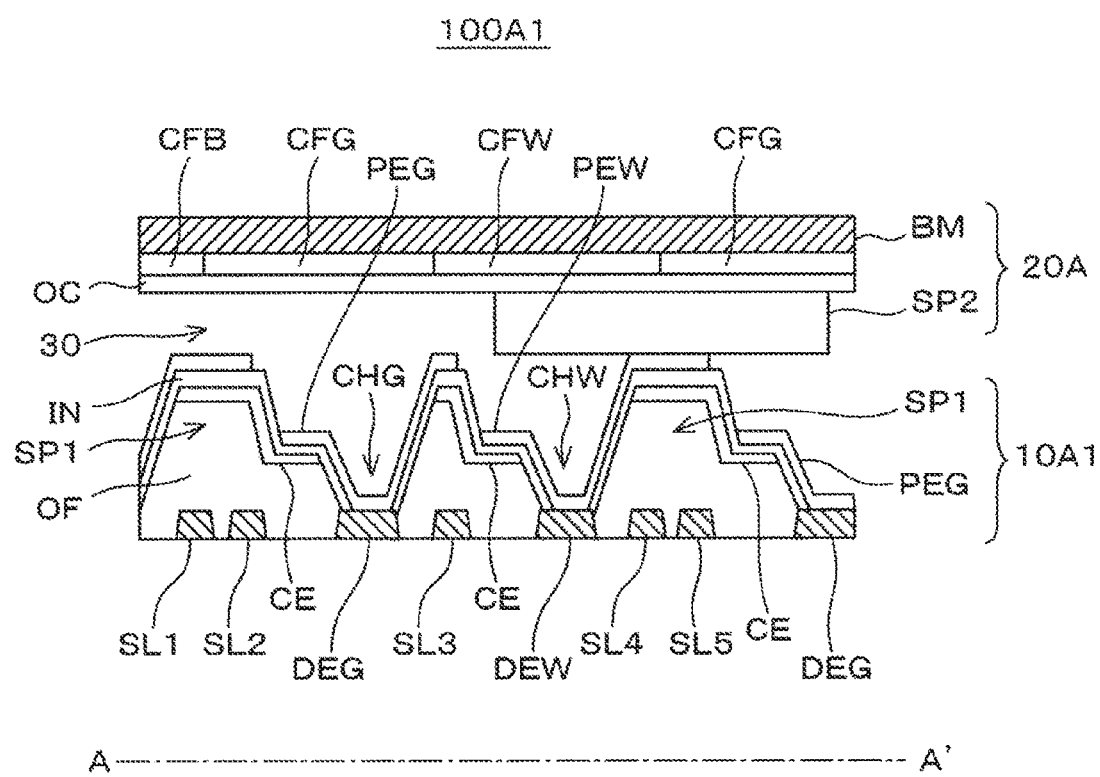
FIG. 11 is a top plan view for use in describing the display device according to the modified example 1-1.

A first modified example (modified example 1-1) according to the first example will be described using FIGS. 10 and 11. FIG. 10 is a top plan view illustrating the scanning lines, signal lines, drain terminals, spacers, and pixel opening portions of a display device according to the modified example 1-1. FIG. 11 is a cross-sectional view taken along the line A-A' of FIG. 10.

The arrangement of the pixels, scanning lines, and signal lines of a display device 100A1 according to the modified example 1-1 is the same as that of the display device 100A; however, the forming position of the first spacer SP1 is different. The second spacer SP2 is the same as that of the display device 100A. In short, when the first and the second spacers are removed from FIG. 10, it becomes the same as FIG. 8A.

In the array substrate 10A1, the signal lines and the drain electrodes are formed of a metal film in the same layer on a transparent substrate such as a glass substrate, not illustrated, and an organic flattening film OF is formed thereon. Of the organic flattening film OF, an organic flattening film on the signal line is formed thicker, hence to form the first spacer SP1. A common electrode CE is formed of a transparent conductive film such as ITO on the organic flattening film OF and an interlayer insulating film IN is formed thereon. On the interlayer insulating film IN, a pixel electrode PE is formed. In the array substrate 10A1, an alignment film, not illustrated, is formed on the interlayer insulating film IN and the pixel electrode PE.

As illustrated in FIG. 11, the area having two adjacent signal lines has a wider flat portion than the area having one signal line. Accordingly, the first spacer SP1 is preferable to be arranged in the area having the two adjacent signal lines along the extending direction of the signal line.

Modified Example 1-2

Figure 12:
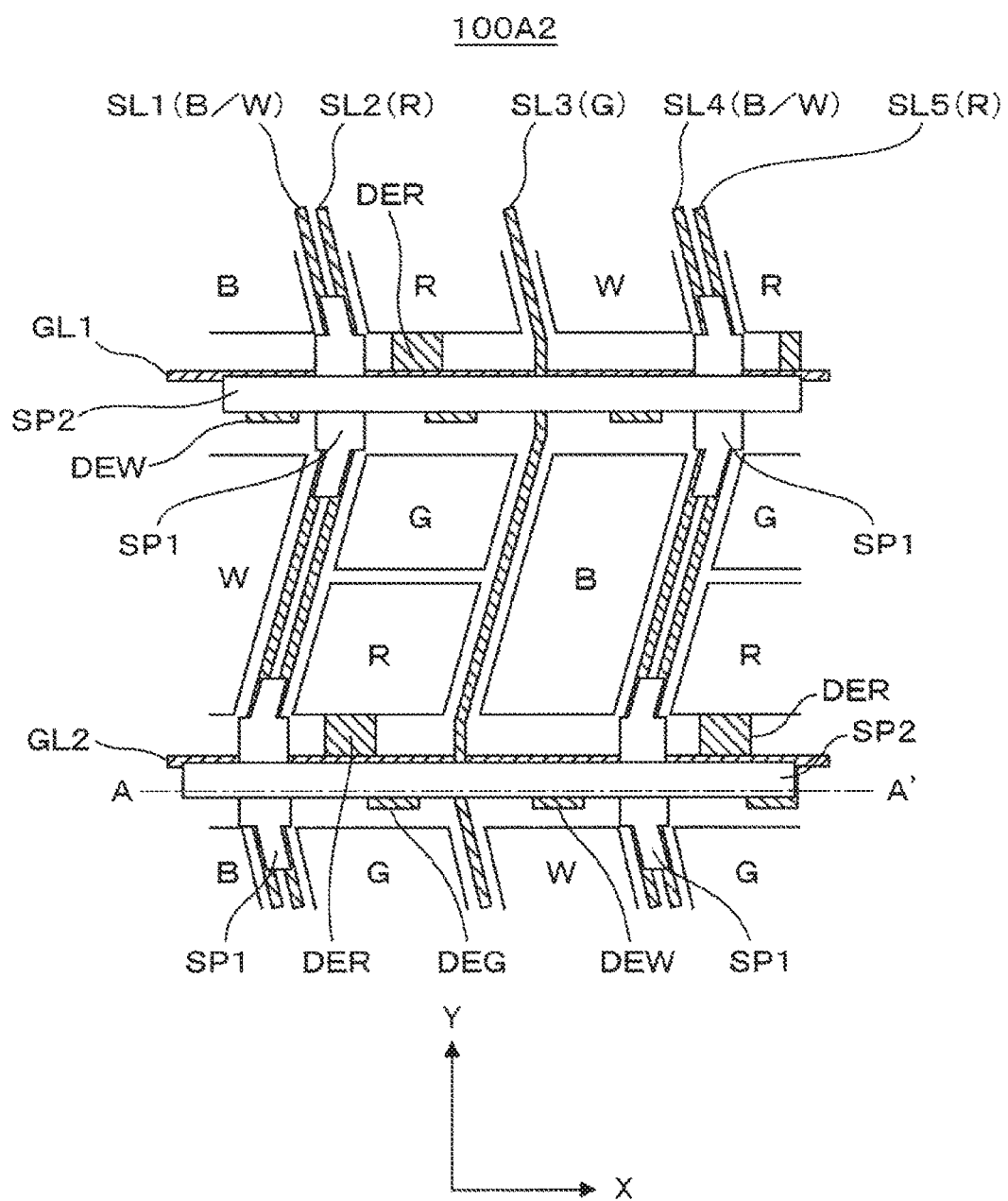
FIG. 12 is a top plan view for use in describing a display device according to a modified example 1-2.
Figure 13:
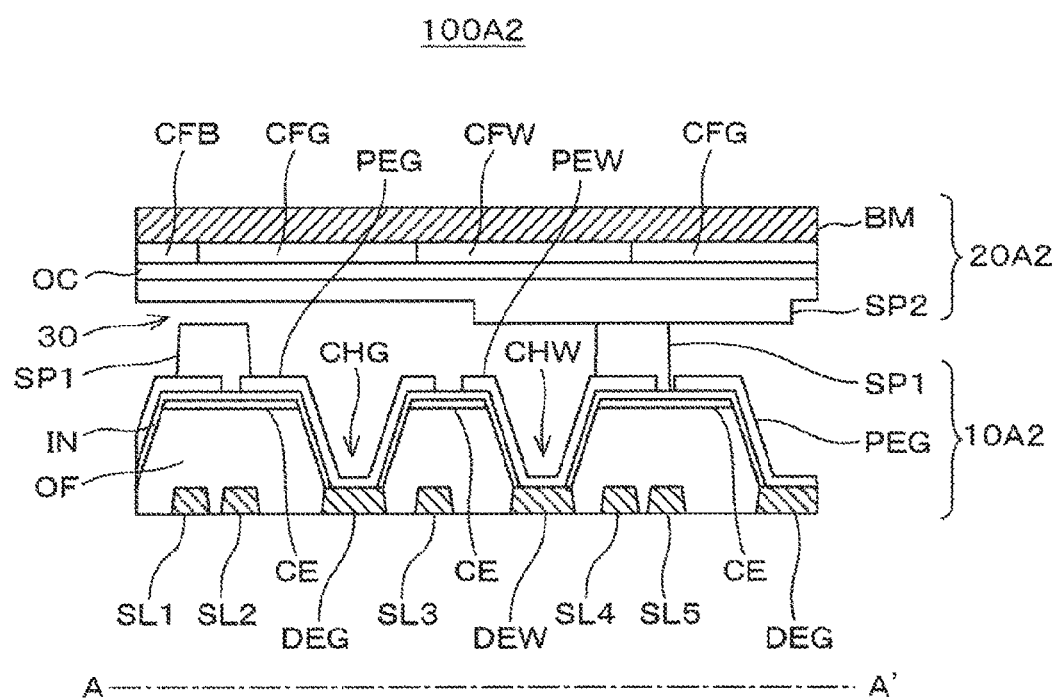
FIG. 13 is a cross-sectional view for use in describing the display device according to the modified example 1-2.

A second modified example (modified example 1-2) according to the first example will be described using FIGS. 12 and 13. FIG. 12 is a top plan view illustrating the scanning lines, signal lines, drain terminals, spacers, and pixel opening portions of a display device according to the modified example 1-2. FIG. 13 is a cross-sectional view taken along the line A-A' of FIG. 12.

The arrangement of the pixels, scanning lines, and signal lines of a display device 100A2 according to the modified example 1-2 is the same as that of the display device 100A;

however, the structure of the second spacer SP2 is different. The first spacer SP1 is the same as that of the display device 100A.

The second spacer SP2 is arranged continuously along the direction of the scanning line, extending across at least five or more signal lines: SL1, SL2, SL3, SL4, SL5 or the like. The thickness of the second spacer SP2 is not uniform but includes a thick portion and a thin portion. The thick portion of the second spacer SP2 forms a main spacer with the first spacer SP1 and the thin portion of the second spacer SP2 forms a sub spacer with the first spacer SP1. Here, the main spacer always keeps the space between the array substrate and the opposite substrate and the sub spacer keeps the space between the array substrate and the opposite substrate when a force is imposed there.

Modified Example 1-3

Figure 14:
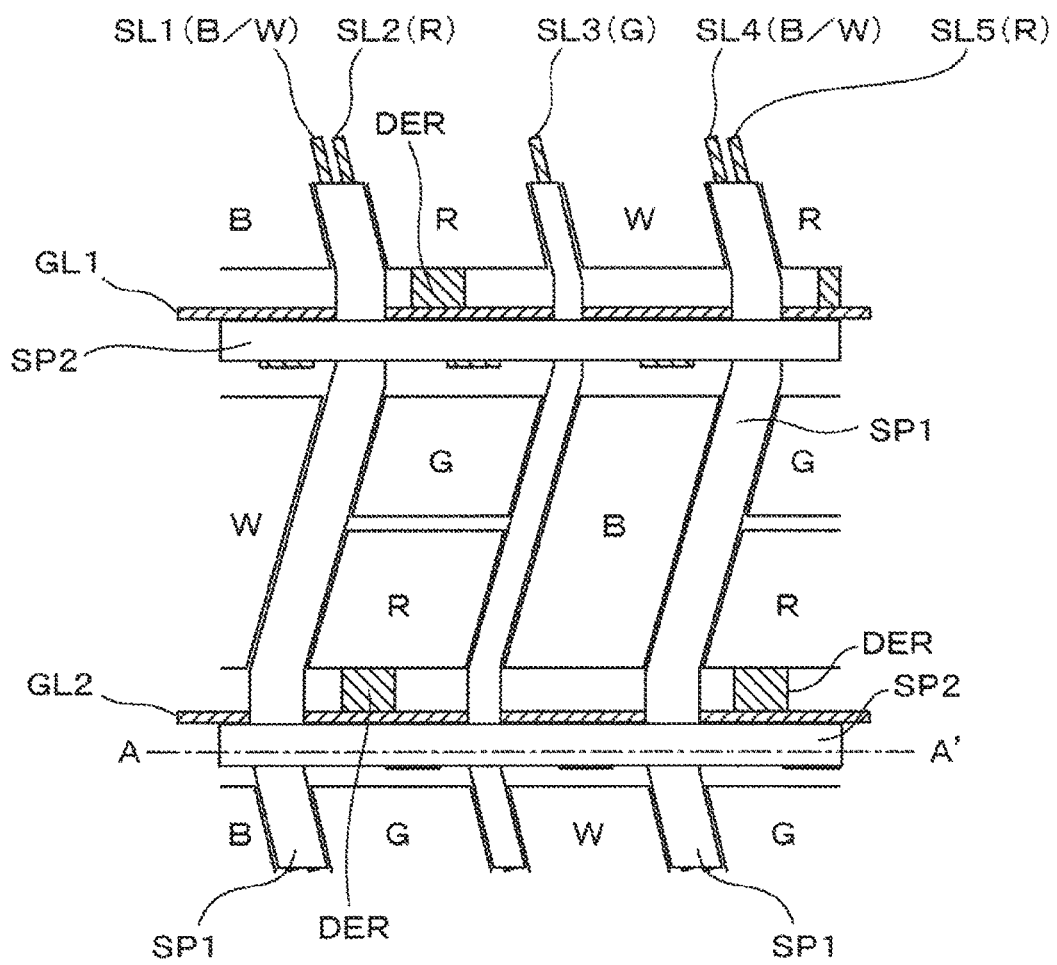
FIG. 14 is a top plan view for use in describing a display device according to a modified example 1-3.
Figure 15:
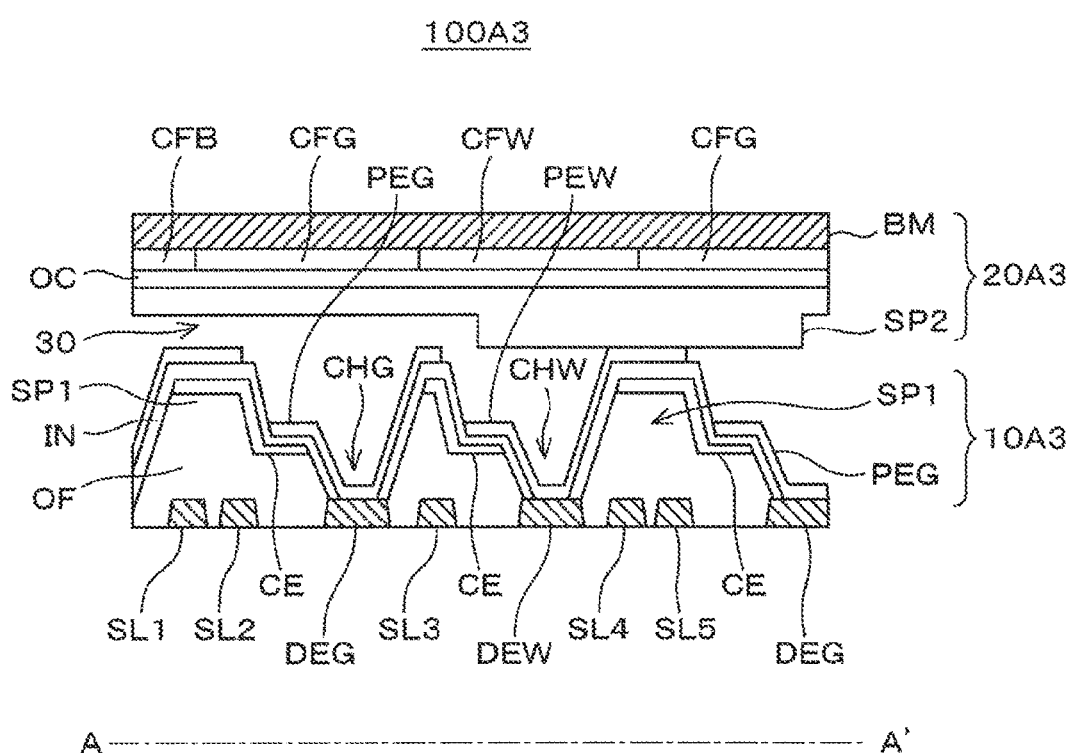
FIG. 15 is a cross-sectional view for use in describing the display device according to the modified example 1-3.

A third modified example (modified example 1-3) according to the first example will be described using FIGS. 14 and 15. FIG. 14 is a top plan view illustrating the scanning lines, signal lines, drain terminals, spacers, and pixel opening portions of a display device according to the modified example 1-3. FIG. 15 is a cross-sectional view taken along the line A-A' of FIG. 14.

The arrangement of the pixels, scanning lines, and signal lines of a display device 100A3 is the same as that of the display device 100A1; however, the structure of the second spacer SP2 is different. The first spacer SP1 is the same as that of the display device 100A.

The second spacer SP2 is arranged continuously along the direction of the scanning line, extending across at least five or more signal lines: SL1, SL2, SL3, SL4, SL5 or the like. The second spacer SP2 is not uniform in the thickness but includes a thick portion and a thin portion. The thick portion of the second spacer SP2 forms a main spacer with the first spacer SP1 and the thin portion of the second spacer SP2 forms a sub spacer with the first spacer SP1. Here, the main spacer always keeps the space between the array substrate and the opposite substrate and the sub spacer keeps the space between the array substrate and the opposite substrate when a force is imposed there.

Modified Example 1-4

Figure 16:
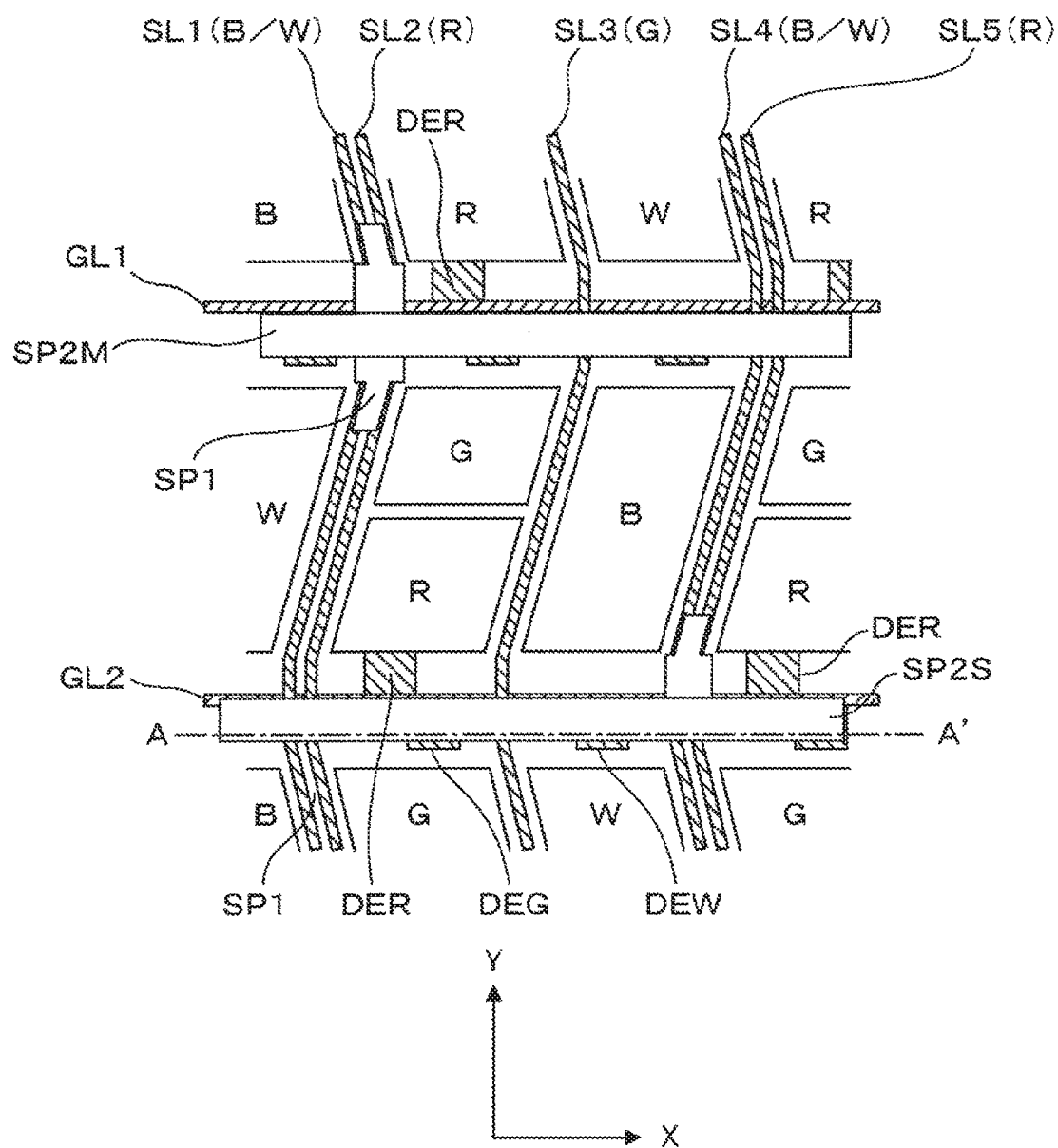
FIG. 16 is a top plan view for use in describing a display device according to a modified example 1-4.
Figure 17:
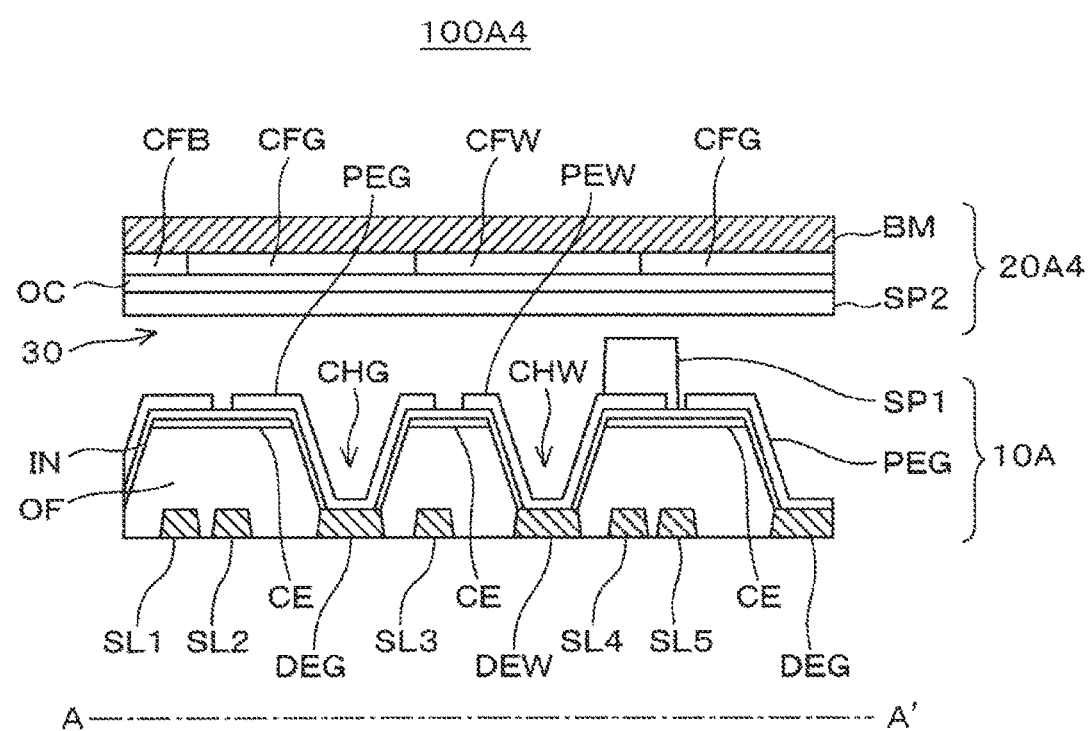
FIG. 17 is a cross-sectional view for use in describing the display device according to the modified example 1-4.

A fourth modified example (modified example 1-4) according to the first example will be described using FIGS. 16 and 17. FIG. 16 is a top plan view illustrating the scanning lines, signal lines, drain terminals, spacers, and pixel opening portions of a display device according to the modified example 1-4. FIG. 17 is a cross-sectional view taken along the line A-A' of FIG. 16.

The arrangement of the pixels, scanning lines, and signal lines of a display device 100A4 according to the modified example 1-4 is the same as that of the display device 100A2; however, the structure of the second spacer SP2 is different. The first spacer SP1 is the same as that of the display device 100A2.

The second spacer SP2 includes a second spacer SP2M for forming a main spacer and a second spacer SP2S for forming a sub spacer. The second spacers SP2M and SP2S are arranged continuously along the direction of the scanning line, extending across at least five or more signal lines: SL1, SL2, SL3, SL4, SL5 or the like, similarly to the second spacer SP2 of the display device 100A2. The thickness of the second spacers SP2M and SP2S is uniform. The second spacer SP2M is thicker than the second spacer SP2. The second spacer SP2M forms a main spacer with the first spacer SP1 and the second spacer SP2S forms a sub spacer with the first spacer SP1.

Modified Example 1-5

Figure 18:
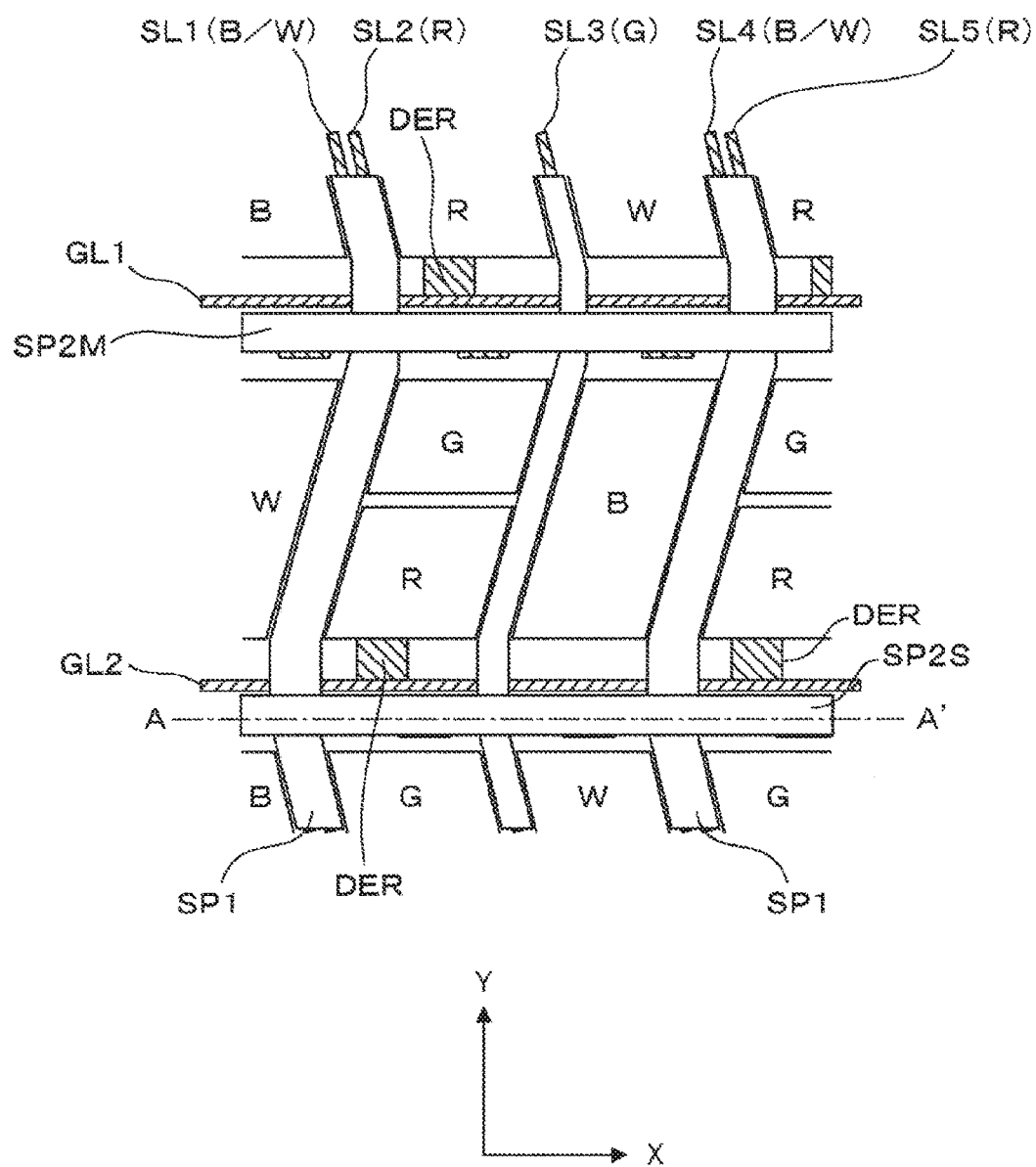
FIG. 18 is a top plan view for use in describing a display device according to a modified example 1-5.
Figure 19:
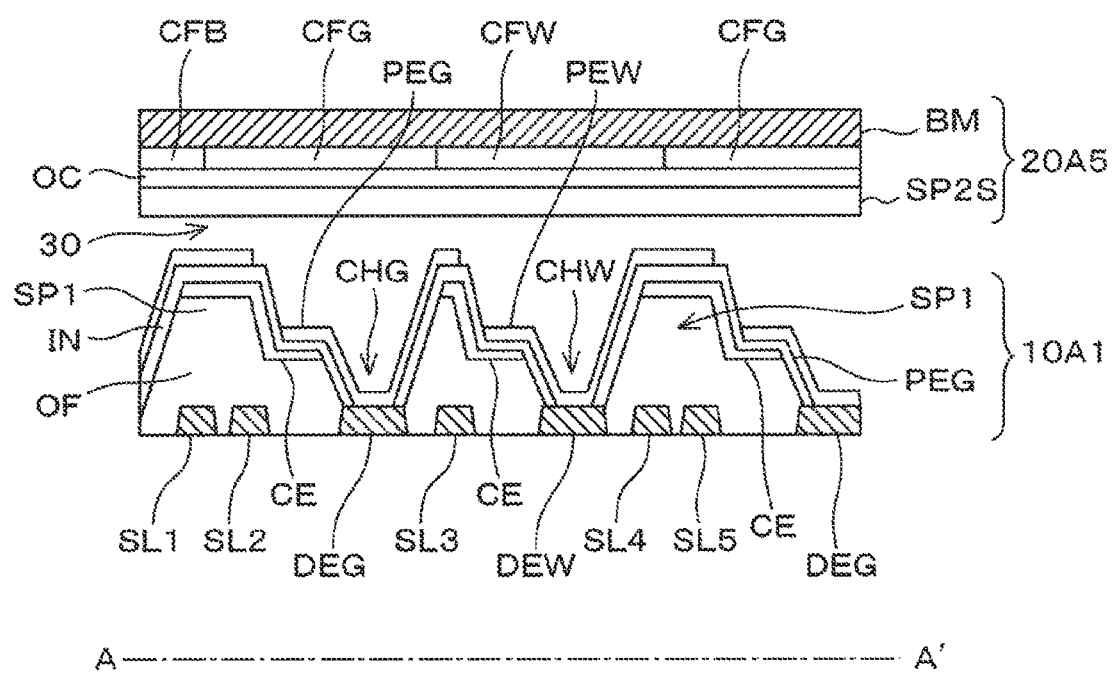
FIG. 19 is a cross-sectional view for use in describing the display device according to the modified example 1-5.

A fifth modified example (modified example 1-5) according to the first example will be described using FIGS. 18 and 19. FIG. 18 is a top plan view illustrating the scanning lines, signal lines, drain terminals, spacers, and pixel opening portions of a display device according to the modified example 1-5. FIG. 19 is a cross-sectional view taken along the line A-A' of FIG. 18.

The arrangement of the pixels, scanning lines, and signal lines of a display device 100A5 according to the modified example 1-5 is the same as that of the display device 100A3; however, the structure of the second spacer SP2 is different. The first spacer SP1 is the same as that of the display device 100A3.

The second spacer SP2 includes a second spacer SP2M for forming a main spacer and a second spacer SP2S for forming a sub spacer. The second spacers SP2M and SP2S are arranged continuously along the direction of the scanning line, extending across at least five or more signal lines: SL1, SL2, SL3, SL4, SL5, or the like, similarly to the second spacer SP2 of the display device 100A3. The thickness of the second spacers SP2M and SP2S is uniform. The second spacer SP2M is thicker than the second spacer SP2. The second spacer SP2M forms a main spacer with the first spacer SP1 and the second spacer SP2S forms a sub spacer with the first spacer SP1.

Modified Example 1-6

Figure 20:
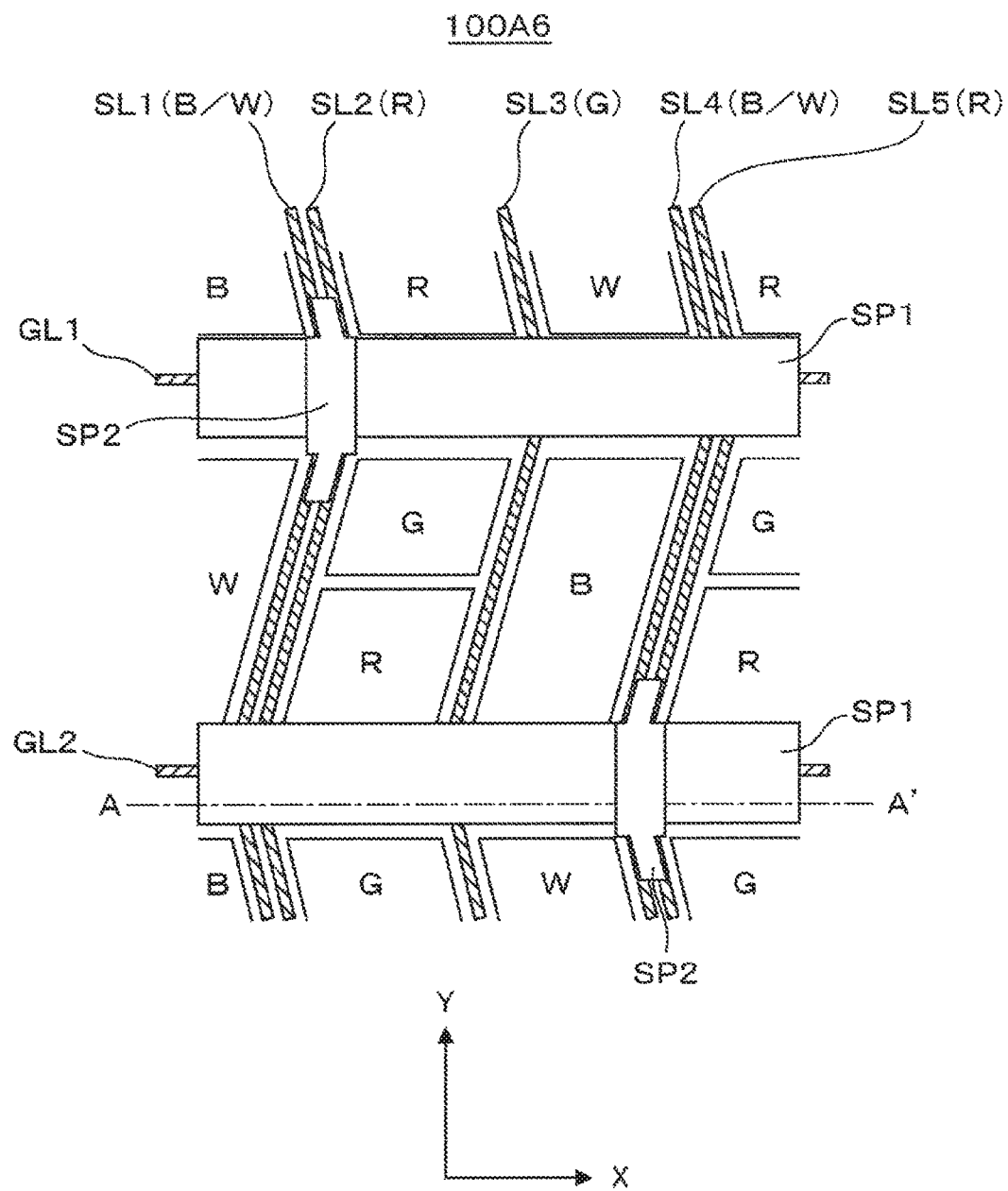
FIG. 20 is a top plan view for use in describing a display device according to a modified example 1-6.
Figure 21:
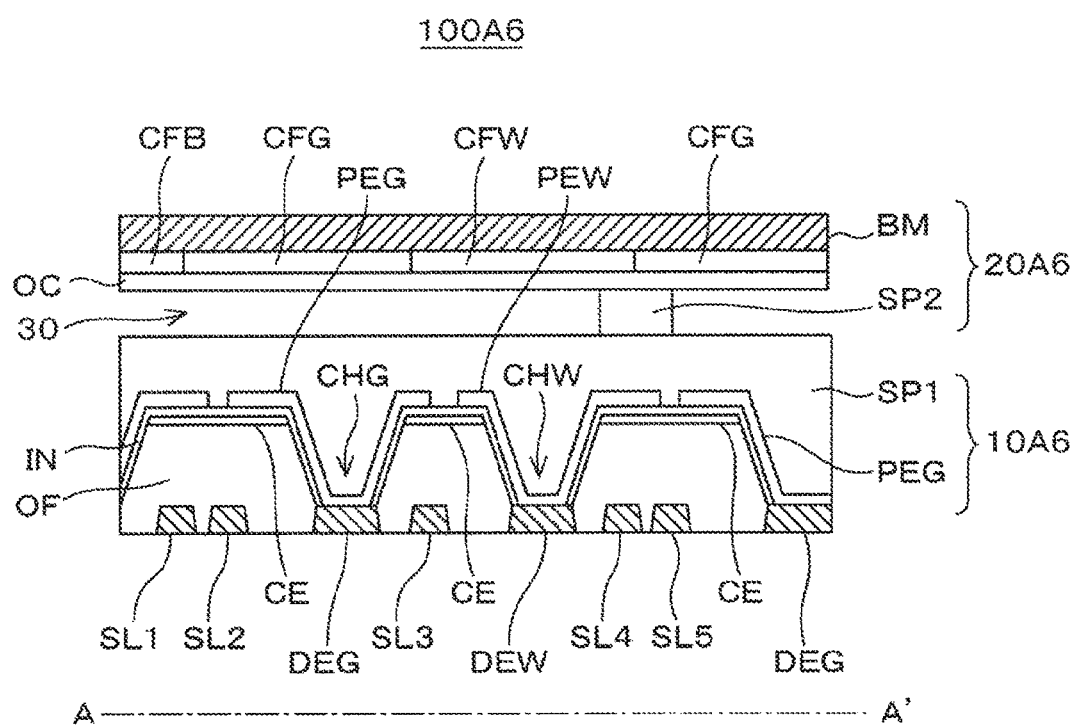
FIG. 21 is a cross-sectional view for use in describing the display device according to the modified example 1-6.

A sixth modified example (modified example 1-6) according to the first example will be described using FIGS. 20 and 21. FIG. 20 is a top plan view illustrating the scanning lines, signal lines, drain terminals, spacers, and pixel opening portions of a display device according to the modified example 1-6. FIG. 21 is a cross-sectional view taken along the line A-A' of FIG. 20.

The arrangement of the pixels, scanning lines, and signal lines of a display device 100A6 according to the modified example 1-6 is the same as that of the display device 100A; however, the structure of the first spacer SP1 and the second spacer SP2 is different.

The first spacer SP1 is arranged continuously along the direction of the scanning line, extending across at least five or more signal lines: SL1, SL2, SL3, SL4, SL5, or the like.

The second spacer SP2 is arranged in the area having two adjacent signal lines along the extending direction of the signal line. The second spacer SP2 is formed in a way of extending one signal line of the scanning line GL1 or the scanning line GL2 and not extending to another scanning line. The second spacer SP2 is formed wider in a portion of extending the signal lines SL1, SL2, SL4, and SL5 along the Y direction and narrower in an inclined portion of the above signal lines from the Y direction.

Modified Example 1-7

Figure 22:
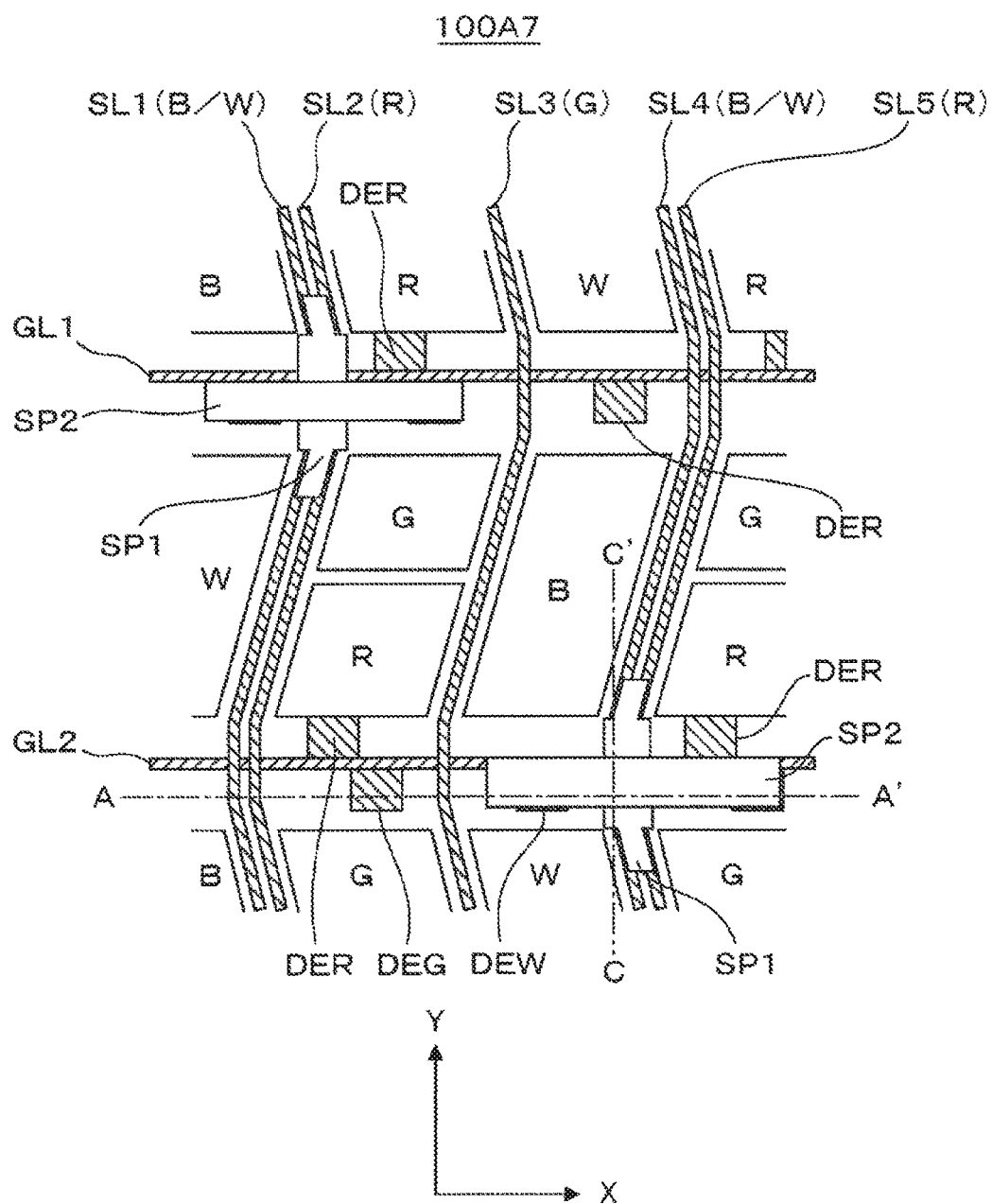
FIG. 22 is a top plan view for use in describing a display device according to a modified example 1-7.
Figure 23:
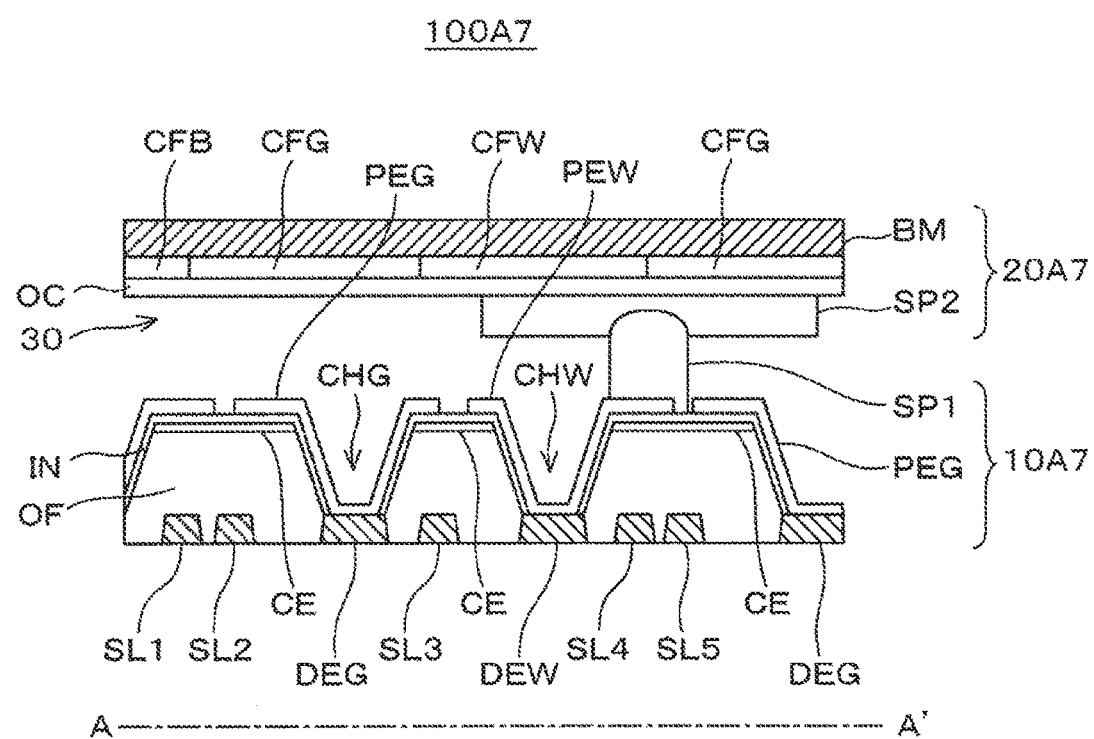
FIG. 23 is a cross-sectional view for use in describing the display device according to the modified example 1-7.
Figure 24:
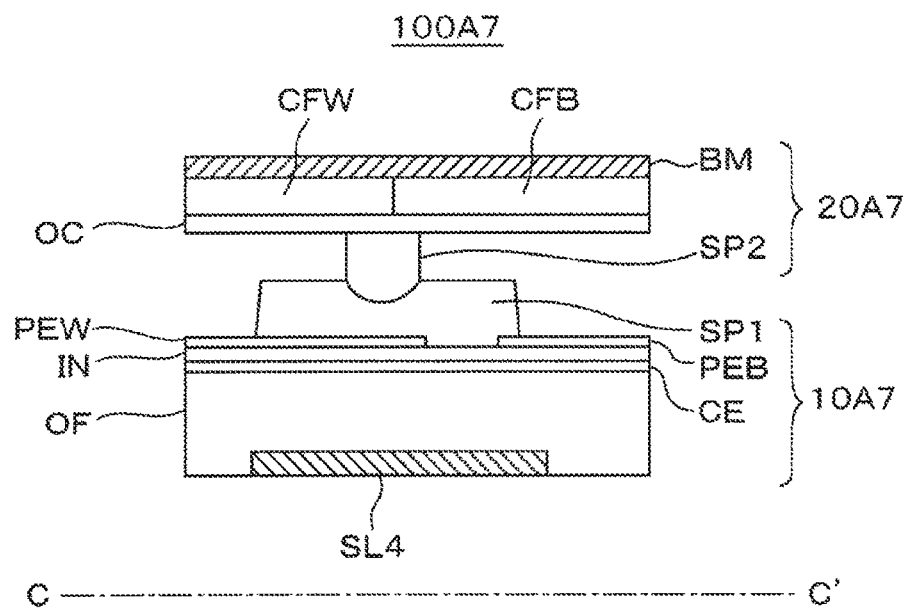
FIG. 24 is a cross-sectional view for use in describing the display device according to the modified example 1-7.
Figure 25:
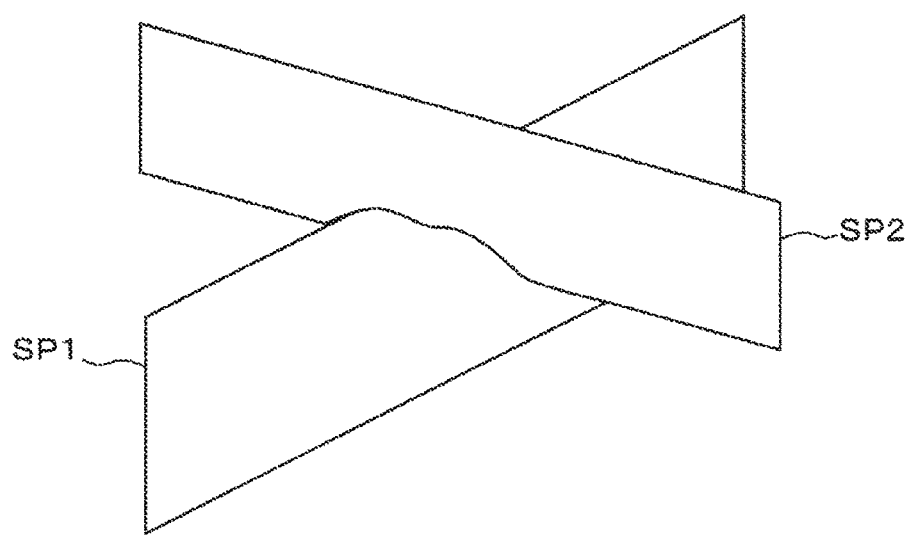
FIG. 25 is a perspective view for use in describing the display device according to the modified example 1-7.

A seventh modified example (modified example 1-7) according to the first example will be described using FIGS. 22 to 25. FIG. 22 is a top plan view illustrating the scanning lines, signal lines, drain terminals, spacers, and pixel opening portions of a display device according to the modified example 1-7. FIG. 23 is a cross-sectional view taken along the line A-A' of FIG. 22. FIG. 24 is a cross-sectional view taken along the line C-C' of FIG. 22. FIG. 25 is an image perspective view of an intersection portion of the first spacer and the second spacer.

The arrangement of the pixels, scanning lines, and signal lines of a display device 100A7 according to the modified example 1-7 is the same as that of the display device 100A; however, the shape of the first spacer SP1 and the second spacer SP2 is different.

As illustrated in FIGS. 23, 24, and 25, the first spacer SP1 and the second spacer SP2 have a concavo-convex portion in their intersection portion. By engaging the concavo-convex portion of the first spacer SP1 and the second spacer SP2 together, the first spacer SP1 and the second spacer SP2 are difficult to move; as the result, even when the first spacer SP1 and the second spacer SP2 are elastically deformed, a flaw hardly occurs.

Second Example

Figure 26A:
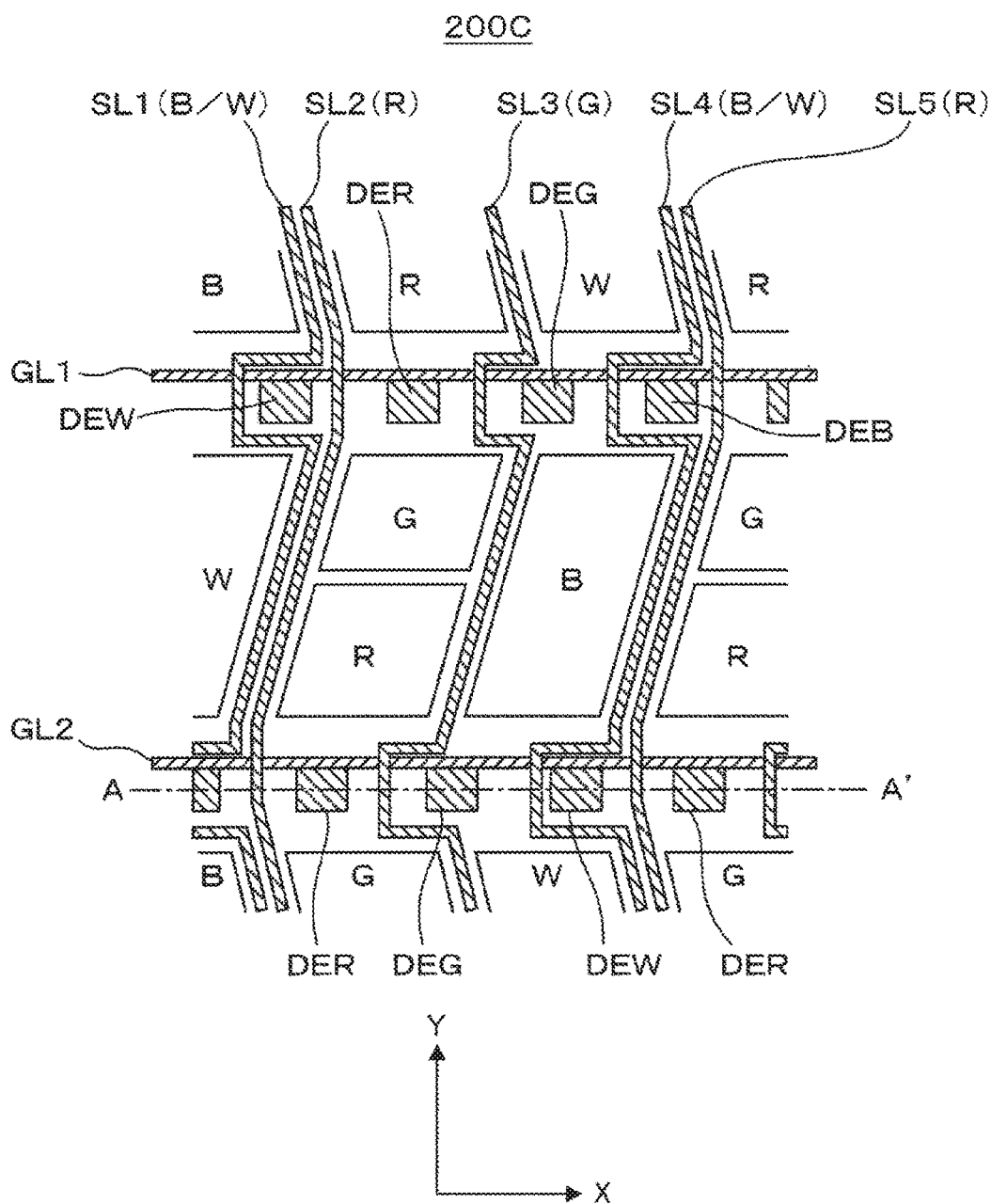
FIG. 26A is a top plan view for use in describing a display device according to a second example.
Figure 26B:
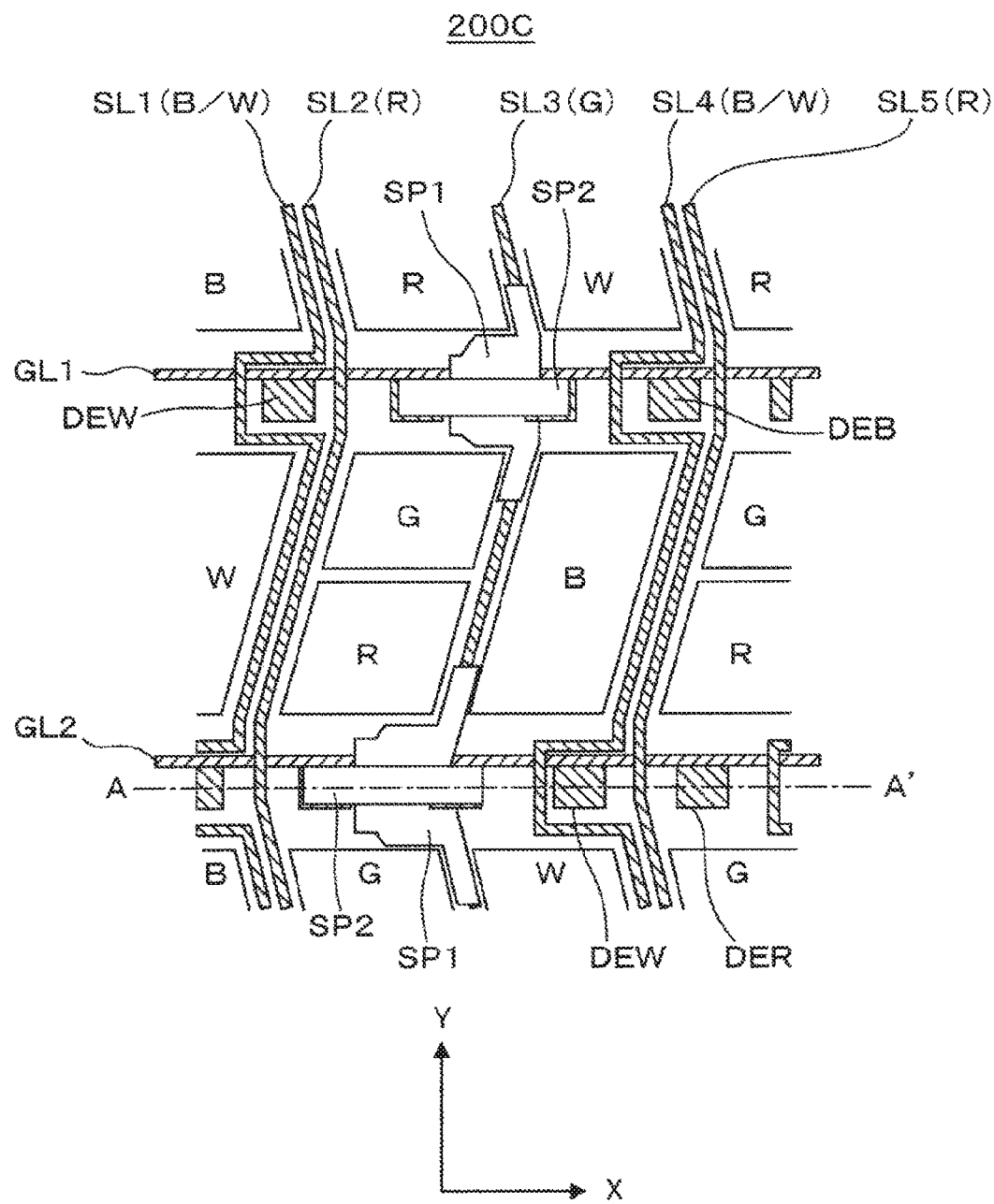
FIG. 26B is a top plan view for use in describing the display device according to the second example.
Figure 27:
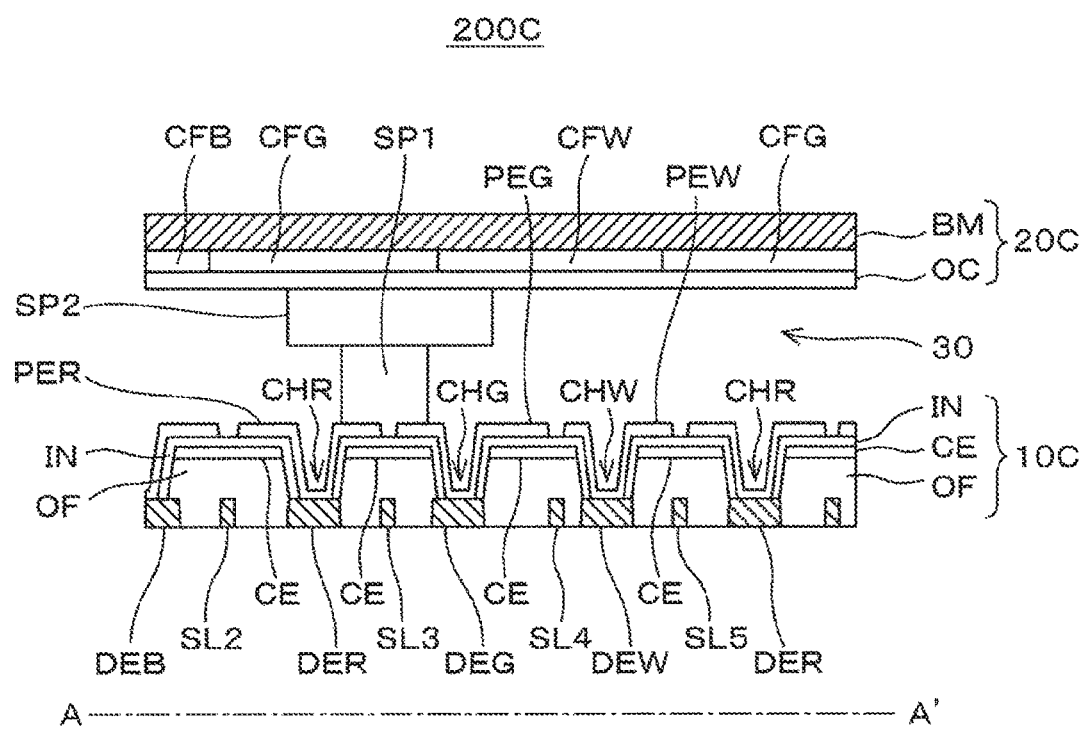
FIG. 27 is a cross-sectional view for use in describing the display device according to the second example.

An example (second example) according to the second embodiment will be descried using FIGS. 26A, 26B, and 27. FIG. 26A is a top plan view illustrating the scanning lines, signal lines, drain terminals, and pixel opening portions of a display device according to the second example. FIG. 26B is a top plan view with spacers added to FIG. 26A. FIG. 27 is a cross-sectional view taken along the line A-A' of FIG. 26B.

A display device 200C according to the second example has the same structure or configuration of the display device 100A, except for the arrangement of the signal lines, drain electrodes, first and second spacers.

As illustrated in FIG. 26A, the scanning lines GL1 and GL2 are provided along the X direction, the signal lines SL1, SL2, SL3, SL4, and SL5 are provided along the Y direction in the vicinity of crossing the scanning lines GL1 and GL2 and inclined at a predetermined angle from the Y direction between the opening portions of the sub pixels. A drain electrode DER connected to the pixel electrode of a red sub pixel is arranged on each lower side of the scanning lines GL1 and GL2 on the drawing, and a drain electrode DEG connected to the pixel electrode of a green sub pixel is arranged on each lower side of the scanning lines GL1 and GL2 on the drawing. In other words, the drain electrode DER and the drain electrode DEG are arranged on the same side of the scanning line GL1 or the scanning line GL2. A drain electrode DEW connected to the pixel electrode of a white sub pixel is arranged on each lower side of the scanning lines GL1 and GL2. A drain electrode DEB connected to the pixel electrode of a blue sub pixel is arranged on each lower side of the scanning lines GL1 and GL2 on the drawing.

The drain electrode DEW and the drain electrode DEB are arranged between the signal line SL1 and the signal line SL2 and between the signal line SL4 and the signal line SL5. Each of the signal line SL1 and the signal line SL4 is deviated to avoid the drain electrode DEW and the drain electrode DEB. Further, the signal line SL3 is deviated to avoid the drain electrode DEG. In other words, each of the signal lines SL1, SL3, and SL4 has a portion extending along the X direction and a portion extending along the Y direction in the vicinity of their crossing the scanning lines GL1 and GL2.

Accordingly, the first spacer SP1 is preferable to be arranged in the area having one signal line along the extending direction of the signal line. This is because the pixel electrode connecting the drain electrode DEG to a green sub pixel opening portion is arranged just under the spacer SP1 and therefore the adhesion of the spacer can be improved. On the other hand, no pixel electrode is arranged on the signal lines SL2 and SL5, although the pixel electrodes are arranged on the signal lines SL1 and SL4, the extending direction of the signal line is curved, which makes the arrangement of the spacer difficult.

The first spacer SP1 is formed in a way of extending across one scanning line of the scanning line GL1 or the scanning line GL2 and not extending to another scanning line. The first spacer SP1 is wide in a portion of extending the signal line SL3 along the Y direction and narrow in an inclined portion of the signal line SL3 from the Y direction. The second spacer SP2 is formed in a way of extending across one signal line of the signal line SL3 and not extending to another signal line. Differently from the first spacer SP1, the width of the second spacer SP2 is uniform.

Thus, the column density gets stable.

Modified Example 2-1

Figure 28:
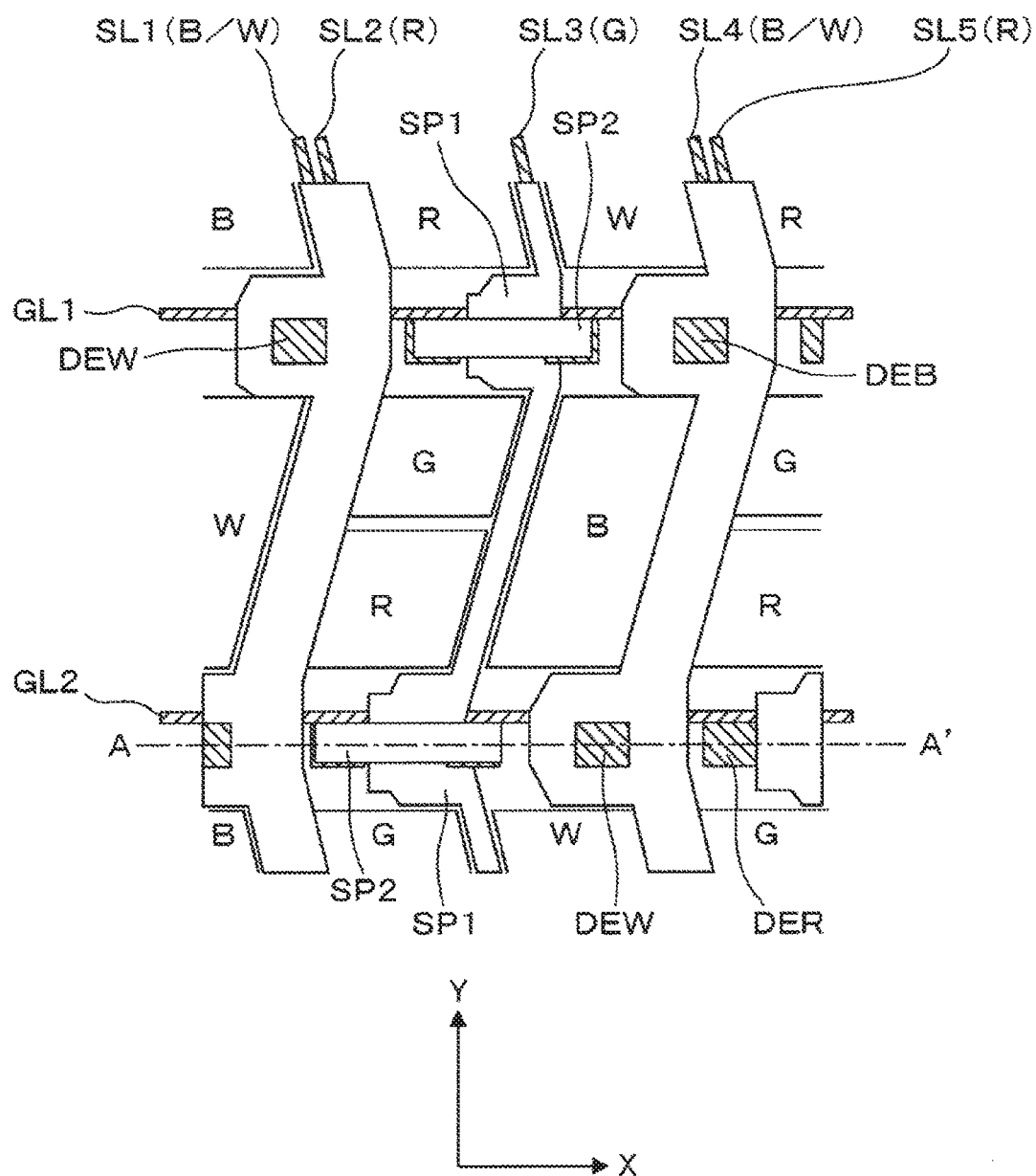
FIG. 28 is a top plan view for use in describing a display device according to a modified example 2-1.
Figure 29:
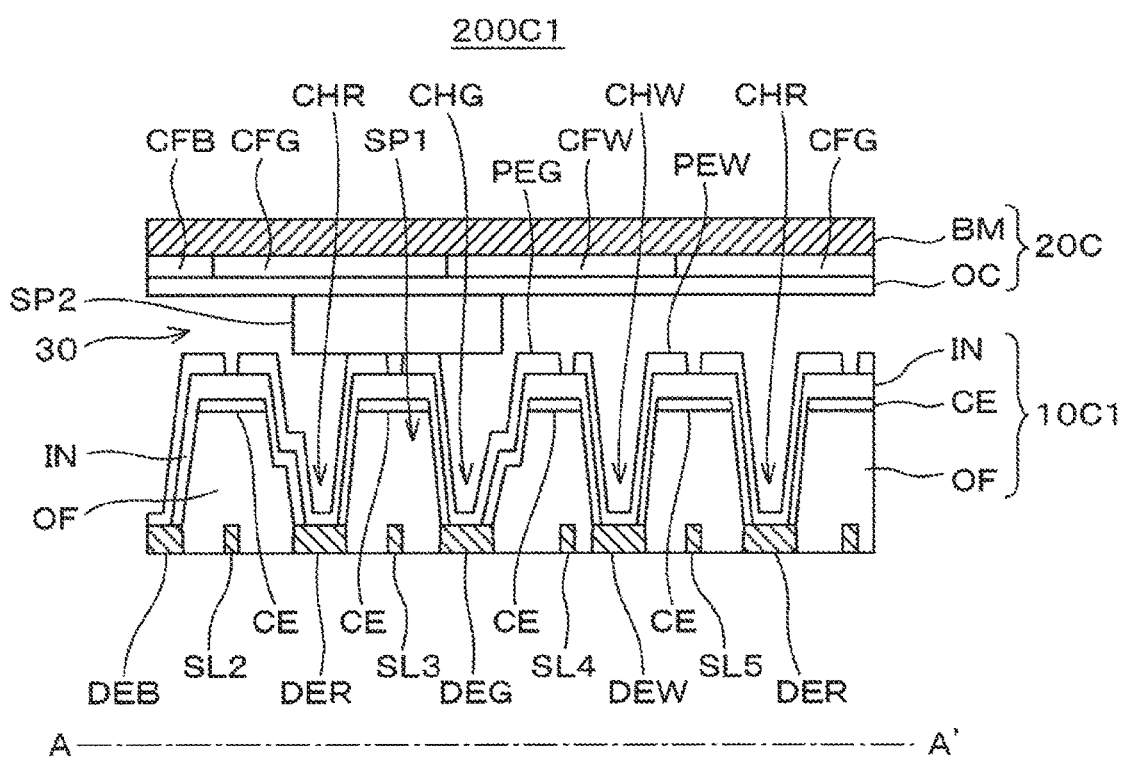
FIG. 29 is a cross-sectional view for use in describing the display device according to the modified example 2-1.

A first modified example (modified example 2-1) according to the second example will be described using FIGS. 28 and 29. FIG. 28 is a top plan view illustrating the scanning lines, signal lines, drain terminals, spacers, and pixel opening portions of a display device according to the modified example 2-1. FIG. 29 is a cross-sectional view taken along the line A-A' of FIG. 28.

The arrangement of the pixels, scanning lines, and signal lines of a display device 200C1 according to the modified example 2-1 is the same as that of the display device 200C; however, the forming position of the first spacer SP1 is different. The second spacer SP2 is the same as that of the display device 200C. The first spacer SP1 of the display device 200C1 is formed in that, of the organic flattening film OF, the organic flattening film on the signal line is formed thicker, similarly to the display device 100A1 of the modified example 1-1. The first spacer SP1 is arranged in the area having one signal line along the extending direction of the signal line (for example, the signal line SL3). The first spacer SP1 is arranged on the signal line SL3, hence to be able to restrain a fluctuation of the column density at the attachment deviation of the array substrate and the opposite substrate. In another position, the column density at the attachment deviation will be extremely increased.

Modified Example 2-2

Figure 30:
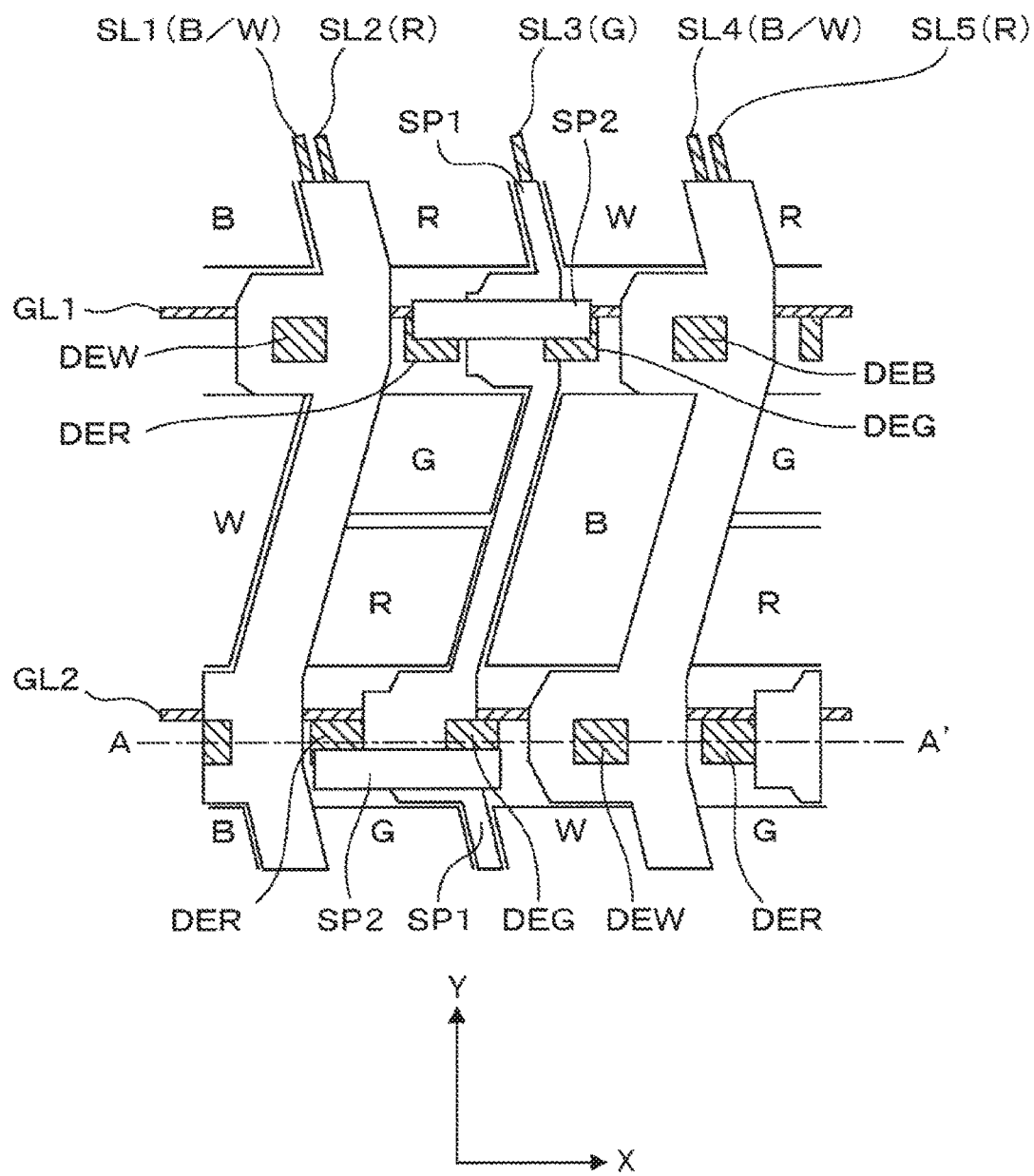
FIG. 30 is a top plan view for use in describing a display device according to a modified example 2-2.
Figure 31:
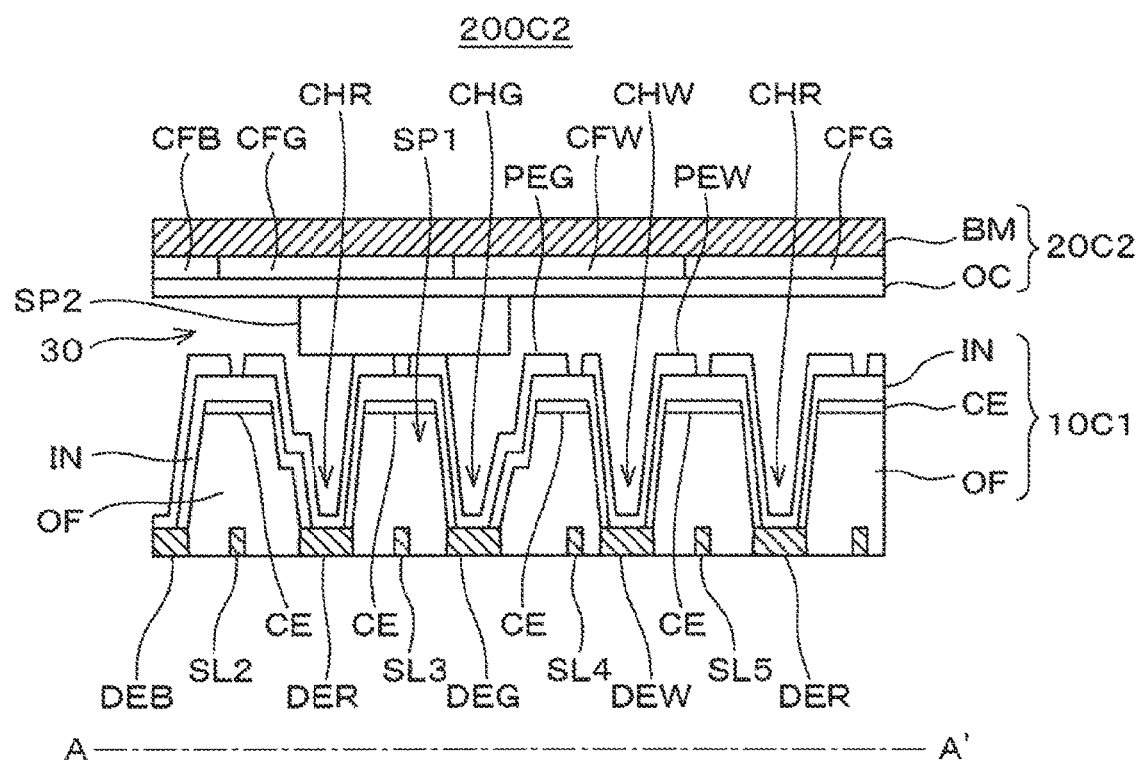
FIG. 31 is a cross-sectional view for use in describing the display device according to the modified example 2-2.

A second modified example (modified example 2-2) according to the second example will be described using FIGS. 30 and 31. FIG. 31 is a top plan view illustrating the scanning lines, signal lines, drain terminals, spacers, and pixel opening portions of a display device according to the modified example 2-2. FIG. 31 is a cross-sectional view taken along the line A-A' of FIG. 30.

The arrangement of the pixels, scanning lines, and signal lines of a display device 200C2 according to the modified example 2-2 is the same as that of the display device 200C1; however, the forming position of the second spacer SP2 is different. The first spacer SP1 is the same as that of the display device 200C1. The second spacer SP2 is arranged in a way of overlapping the contact holes CHR and CHG in half in plan view, and the second spacers SP2 are arranged alternately in two types of arrangement; upper overlapping with the contact holes CHR and CHG and lower overlapping. Similarly to the modified example 2-1, the first spacer SP1 is arranged on the signal line SL3, hence to be able to restrain a fluctuation of the column density at the attachment deviation of the array substrate and the opposite substrate.

Modified Example 2-3

Figure 32:
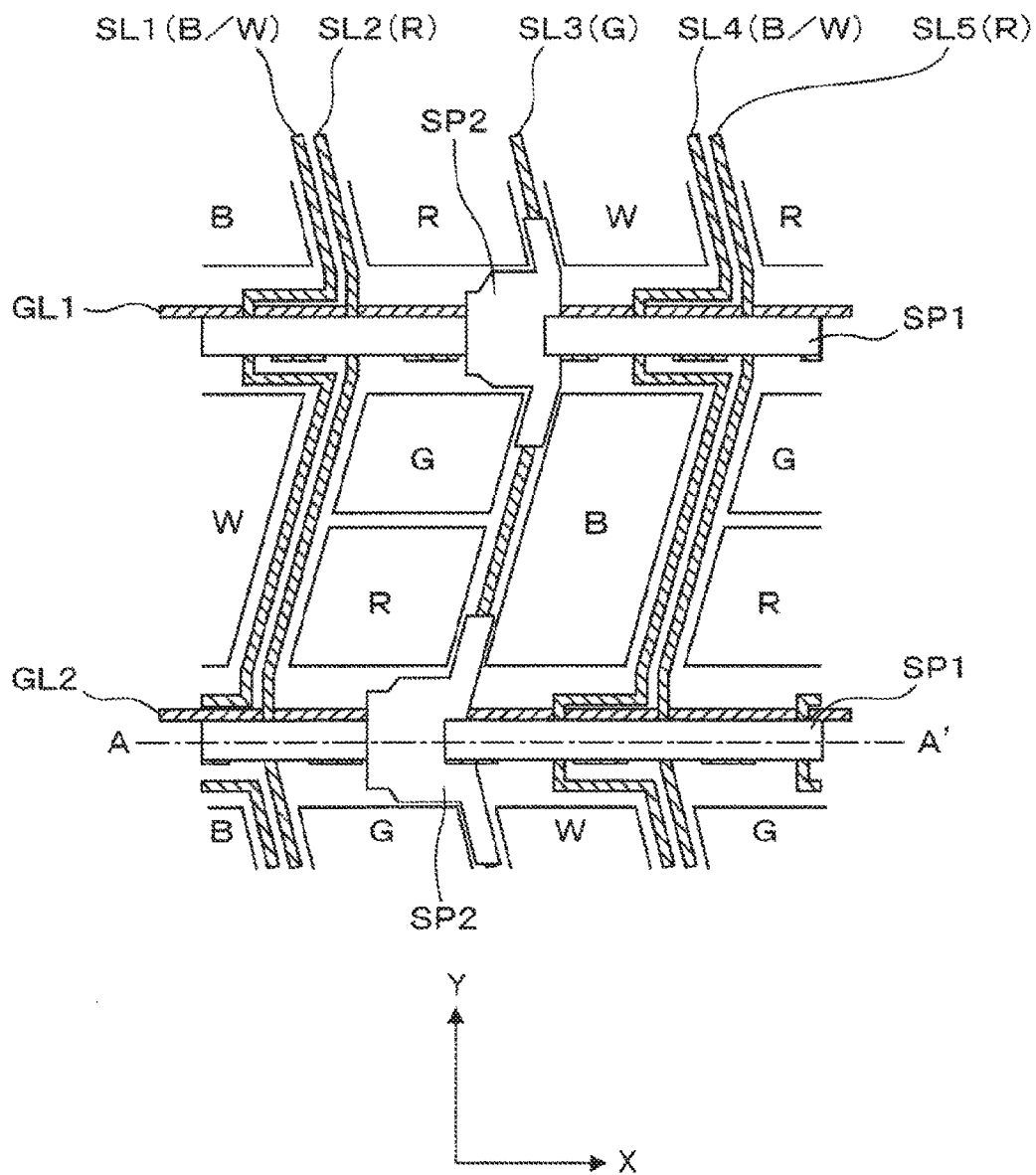
FIG. 32 is a top plan view for use in describing a display device according to a modified example 2-3.
Figure 33:
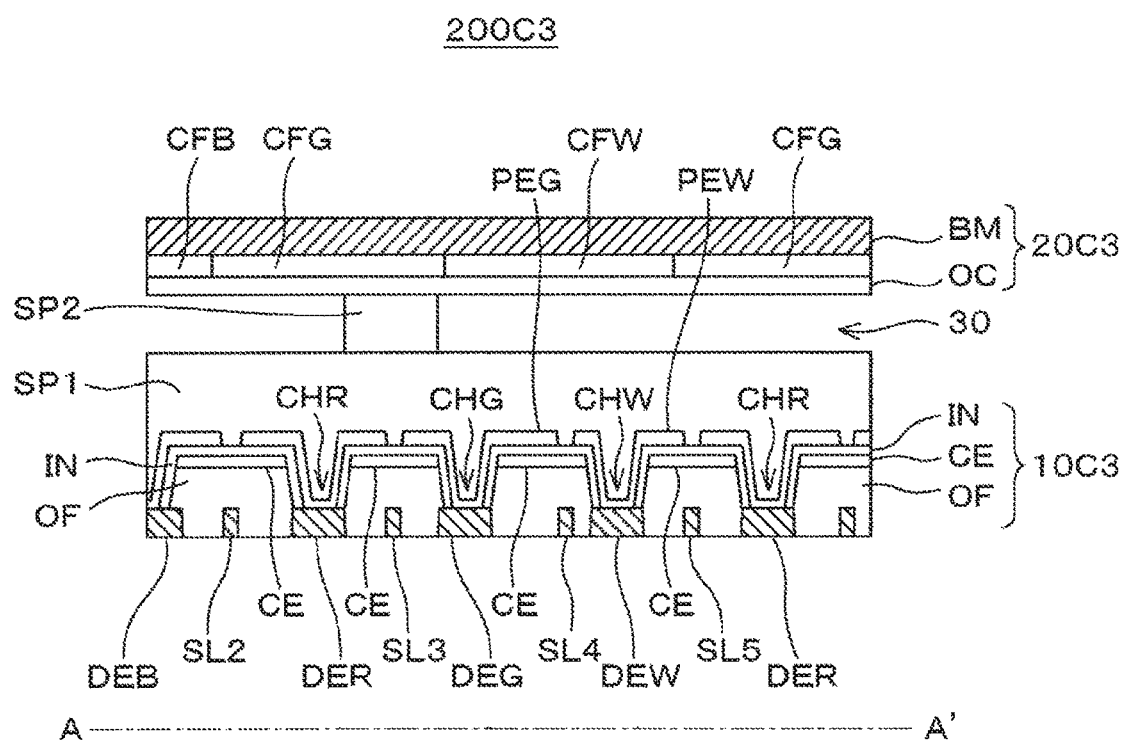
FIG. 33 is a cross-sectional view for use in describing the display device according to the modified example 2-3.

A third modified example (modified example 2-3) according to the second example will be described using FIGS. 32 and 33. FIG. 32 is a top plan view illustrating the scanning lines, signal lines, drain terminals, spacers, and pixel opening portions of a display device according to the modified example 2-3. FIG. 33 is a cross-sectional view taken along the line A-A' of FIG. 32.

The arrangement of the pixels, scanning lines, and signal lines of a display device 200C3 according to the modified example 2-3 is the same as that of the display device 200C; however, the structure of the first spacer SP1 and the second spacer SP2 is different.

The first spacer SP1 is continuously arranged along the direction of the scanning line, extending across at least five or more signal lines: SL1, SL2, SL3, SL4, SL5 or the like.

The second spacer SP2 is arranged in the area having one signal line along the extending direction of the signal line. The second spacer SP2 is formed in a way of extending across one signal line of the scanning line GL1 or the scanning line GL2 and not extending to another scanning line. The second spacer SP2 is wide in a portion of extending the signal line SL3 along the Y direction and narrow in an inclined portion of the signal line SL3 from the Y direction. The arrangement position of the second spacer SP2 is not necessarily restricted to this.

What is claimed is:

1. A display device comprising:
   a first light shielding area where two signal lines are arranged between opening portions of mutually adjacent sub pixels;
   a second light shielding area where one signal line is arranged between opening portions of mutually adjacent sub pixels;
   a third light shielding area where one scanning line is arranged between opening portions of mutually adjacent sub pixels;
   a first spacer that is provided in the first light shielding area or the second light shielding area along an extending direction of the signal line;
   a second spacer that is provided in the third light shielding area along an extending direction of the scanning line,
   a first pixel including a red sub pixel, a green sub pixel, and a white sub pixel, and
   a second pixel including a red sub pixel, a green sub pixel, and a blue sub pixel, wherein
   the first spacer and the second spacer are arranged crosswise, and
   a sub pixel which sandwiches the third light shielding area is the white sub pixel of the first pixel and the blue sub pixel of the second pixel, and the red sub pixel of the first pixel and the green sub pixel of the second pixel.

2. The device according to claim 1, wherein
   the first spacer is provided on a side of an array substrate where the scanning line and the signal line are formed, and
   the second spacer is provided on a side of an opposite substrate where a light shielding film forming the first to the third light shielding areas is arranged.

3. The device according to claim 2, wherein
   sub pixels of which opening portions are adjacent with the scanning line intervening therebetween are connected to the scanning line, and
   drain electrodes respectively connected to pixel electrodes of the sub pixels are arranged with the scanning line intervening therebetween.

4. The device according to claim 3, wherein
   the first spacer is arranged on the signal line in the first light shielding area in an upper layer than the pixel electrode, and
   the second spacer crosses the two signal lines.

* * * * *